(12) United States Patent
Pedersen et al.

(10) Patent No.: US 12,245,386 B2
(45) Date of Patent: *Mar. 4, 2025

(54) PORTABLE DOCK FOR ELECTRONIC KEY RETENTION DEVICES

(71) Applicant: Knox Associates, Inc., Phoenix, AZ (US)

(72) Inventors: Jason Shaun Pedersen, Glendale, AZ (US); Tamara Hatzinger, Phoenix, AZ (US)

(73) Assignee: Knox Associates, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/486,401

(22) Filed: Oct. 13, 2023

(65) Prior Publication Data

US 2024/0260211 A1    Aug. 1, 2024

Related U.S. Application Data

(63) Continuation of application No. 17/816,835, filed on Aug. 2, 2022, now Pat. No. 11,849,550.

(60) Provisional application No. 63/229,028, filed on Aug. 3, 2021.

(51) Int. Cl.
*H05K 5/02*  (2006.01)
*G06F 1/16*  (2006.01)

(52) U.S. Cl.
CPC ......... *H05K 5/0217* (2013.01); *G06F 1/1632* (2013.01)

(58) Field of Classification Search
CPC .......................... H05K 5/0217; G06F 1/1632
See application file for complete search history.

(56) References Cited

U.S. PATENT DOCUMENTS

| | | | |
|---|---|---|---|
| 8,929,065 B2 | 1/2015 | Williams | |
| 9,041,510 B2* | 5/2015 | Wolski | G07C 9/00182 340/5.6 |
| 9,898,041 B2 | 2/2018 | Blowers et al. | |
| 10,473,257 B2 | 11/2019 | Tomomatsu et al. | |
| 11,598,121 B2* | 3/2023 | Pavlovic | G07C 9/00714 |
| 11,626,686 B2 | 4/2023 | Telesco et al. | |
| 11,933,075 B2* | 3/2024 | Pavlovic | G07C 9/00309 |
| 2003/0083115 A1 | 5/2003 | Kato | |
| 2009/0045234 A1 | 2/2009 | Carnevali | |
| 2012/0042703 A1 | 2/2012 | Chang et al. | |
| 2014/0268542 A1* | 9/2014 | Moon | H01R 13/44 361/679.41 |

(Continued)

*Primary Examiner* — Sagar Shrestha
(74) *Attorney, Agent, or Firm* — Knobbe, Martens, Olson & Bear, LLP

(57) ABSTRACT

A key retention device and a portable dock for the key retention device are disclosed. The key retention device includes a key holder and a base. The key holder is rotatably coupled to the base. The base includes pins that extend into a cavity of the key holder when the key holder is in a closed position and do not extend into the cavity when the key holder is in an open position. The base includes a finger that prevents users from inserting an electronic key into the key holder when the key holder is in the closed position. The key retention device can receive the portable dock and lock the key holder in the locked position when a user input is received. The user input can be provided to the key retention device to remove an electronic key from the portable dock or to remove the portable dock altogether.

20 Claims, 17 Drawing Sheets

(56) References Cited

U.S. PATENT DOCUMENTS

| | | |
|---|---|---|
| 2017/0069148 A1* | 3/2017 | Gilbertson ............. G07C 9/257 |
| 2017/0140615 A1 | 5/2017 | Larnac et al. |
| 2017/0199545 A1 | 7/2017 | Tarnoff |
| 2020/0095804 A1* | 3/2020 | Pavlovic ............ G07C 9/00714 |
| 2021/0048848 A1 | 2/2021 | Pischel |
| 2021/0137341 A1 | 5/2021 | Dammkoehler et al. |

\* cited by examiner

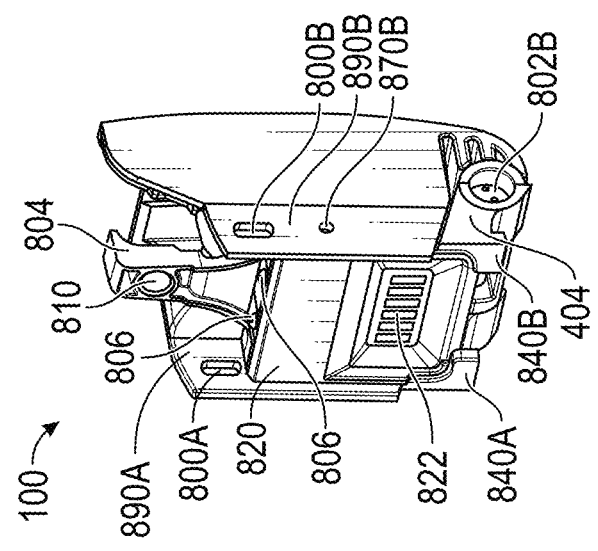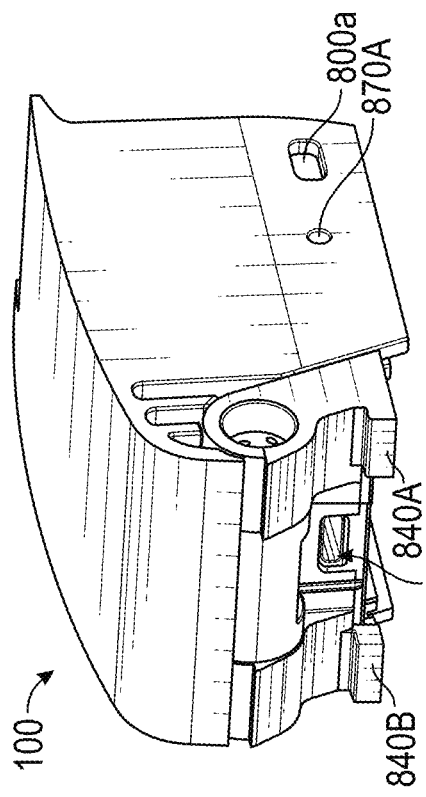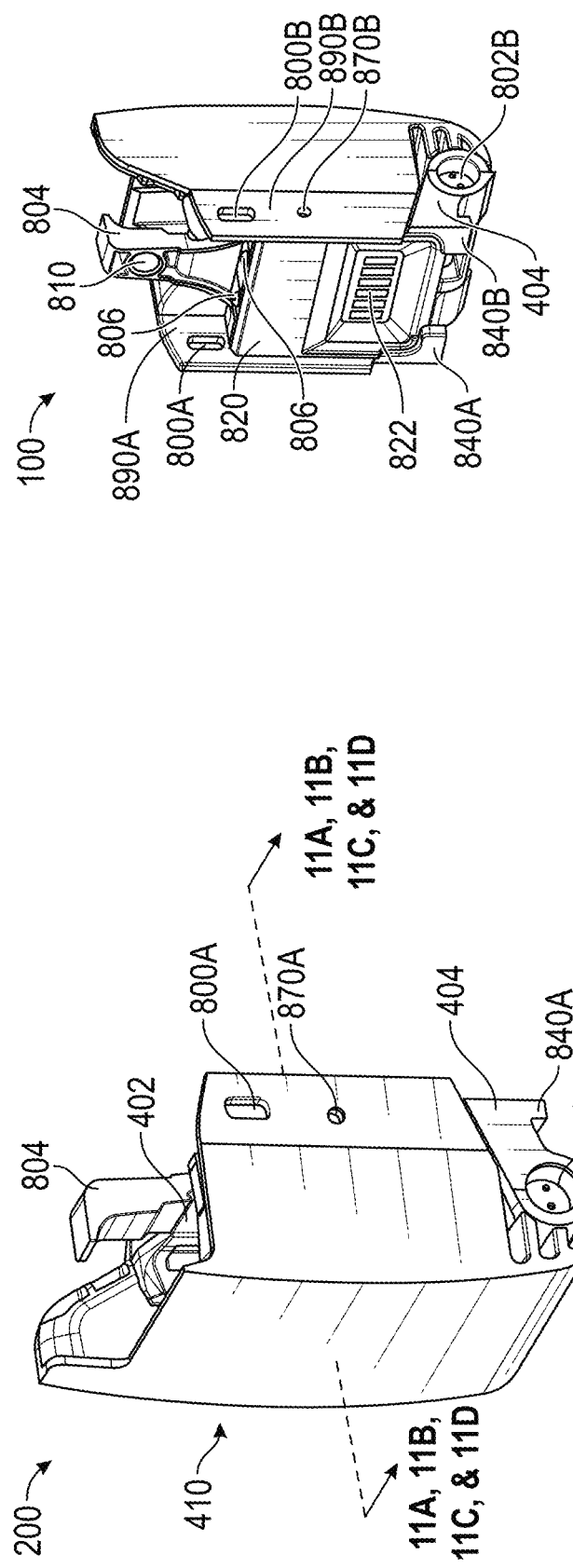

_(1)_

PORTABLE DOCK FOR ELECTRONIC KEY RETENTION DEVICES

RELATED APPLICATIONS

This application is a continuation of U.S. application Ser. No. 17/816,835, filed on Aug. 2, 2022 and titled "A PORTABLE DOCK FOR ELECTRONIC KEY RETENTION DEVICES," the disclosure of which is expressly incorporated by reference herein in its entirety for all purposes, and which claims priority to U.S. Provisional Application No. 63/229,028, which was filed on Aug. 3, 2021 and is titled "A PORTABLE DOCK FOR ELECTRONIC KEY RETENTION DEVICES," the disclosure of which is expressly incorporated by reference herein in its entirety for all purposes. Any and all applications, if any, for which a foreign or domestic priority claim is identified in the Application Data Sheet of the present application are hereby incorporated by reference in their entireties under 37 CFR 1.57.

BACKGROUND

Field

This disclosure is generally related to a portable dock for electronic key retention devices.

SUMMARY

In some aspects, the techniques described herein relate to an electronic key retention device configured to be non-removably attached to a structure and to secure an electronic key, the electronic key retention device including: a portable dock configured to house the electronic key, wherein the portable dock is removably secured to the electronic key retention device, and wherein, the portable dock includes a key holder configured to receive the electronic key, wherein the key holder is configured to move between a closed position and an open position; a portable dock locking system including a locking arm configured to transition between a locked state and an unlocked state, wherein the portable dock locking system is configured to secure the portable dock to the electronic key retention device; an actuator configured to transition the portable dock locking system between the locked state and the unlocked state by at least retracting the locking arm; and a docking seat configured to receive and couple with the portable dock, wherein when the docking seat is coupled with the portable dock: in response to receiving a first user input, a door of the portable dock is configured to move from the closed position to the open position; and in response to receiving a second user input, the actuator is configured to cause the portable dock locking system to transition from the locked state to the unlocked state.

In some aspects, the techniques described herein relate to an electronic key retention device, wherein the structure includes a vehicle.

In some aspects, the techniques described herein relate to the electronic key retention device is further configured to draw power from the vehicle at least when the vehicle is running.

In some aspects, the techniques described herein relate to an electronic key retention device, further including a network interface system configured to communicate with a remote system via a communication system of the structure.

In some aspects, the techniques described herein relate to an electronic key retention device, wherein the portable dock further includes a transceiver configured to establish a wireless connection with a remote system using a wireless communication protocol. In some aspects, the techniques described herein relate to an electronic key retention device, wherein the wireless communication protocol includes a short-distance wireless communication protocol or a near-field communication protocol.

In some aspects, the techniques described herein relate to an electronic key retention device, wherein the locking arm of the portable dock locking system is configured to translate along an axis between a locked position corresponding to the locked state and an unlocked position corresponding to the unlocked state.

In some aspects, the techniques described herein relate to an electronic key retention device, wherein the axis corresponds to a width of the electronic key retention device.

In some aspects, the techniques described herein relate to an electronic key retention device, wherein the docking seat includes slots corresponding to protrusions of the portable dock, and wherein the slots are configured to engage the protrusions to maintain coupling between the docking seat and the portable dock.

In some aspects, the techniques described herein relate to an electronic key retention device, further including a user interface, wherein the first user input and the second user input are received in response to interaction with the user interface.

In some aspects, the techniques described herein relate to an electronic key retention device, wherein the user interface includes one or more of a keypad, a touchscreen interface, or a dial.

In some aspects, the techniques described herein relate to an electronic key retention device, further including a status indicator configured to output an indication of a status of a configuration of the portable dock locking system.

In some aspects, the techniques described herein relate to an electronic key retention device, further including a set of electrical contacts configured to electrically connect to a set of pins of the portable dock when the portable dock is coupled to the docking seat.

In some aspects, the techniques described herein relate to an electronic key retention device, wherein the set of electrical contacts are configured to communicate one or more of data, commands, or power between the electronic key retention device and the portable dock.

In some aspects, the techniques described herein relate to a portable dock of an electronic key retention device, the portable dock configured to secure an electronic key, the portable dock including: a base connected to an electronics housing including a plurality of pins configured to electrically connect to a plurality of electrical contacts of the electronic key when the electronic key is inserted into the portable dock; and a key holder including a cavity and a slot, the cavity configured to receive and store the electronic key, wherein: the key holder is rotatably coupled to the base and configured to move between a closed position and an open position; the plurality of pins is configured to be positioned within the cavity of the key holder when the key holder is in the closed position enabling the plurality of pins to electrically connect to the plurality of electrical contacts of the electronic key when the electronic key is inserted into the key holder of the portable dock; and the plurality of pins are removed from the cavity of the key holder when the key holder is in the open position disengaging the plurality of pins from the plurality of electrical contacts of the electronic key when the electronic key is inserted into the key holder.

In some aspects, the techniques described herein relate to a portable dock, wherein the key holder includes an opening configured to engage a locking arm of a portable dock locking system of the electronic key retention device.

In some aspects, the techniques described herein relate to a portable dock, wherein the base further includes a detent configured to engage a corresponding slot of the electronic key retention device when the portable dock is inserted into the electronic key retention device.

In some aspects, the techniques described herein relate to a portable dock, wherein the detent includes a spring-loaded ball detent.

In some aspects, the techniques described herein relate to a portable dock, wherein the base further includes a finger configured to extend over at least a portion of an opening of the cavity when the key holder is in the closed position.

In some aspects, the techniques described herein relate to a portable dock, wherein the finger is further configured to position the electronic key within the cavity as the key holder transitions from the open position to the closed position.

In some aspects, the techniques described herein relate to a portable dock, wherein the base further includes a detent configured to engage a corresponding opening of the key holder to secure the base to the key holder.

In some aspects, the techniques described herein relate to a portable dock, further including a transceiver configured to establish a wireless connection with a remote device.

In some aspects, the techniques described herein relate to a portable dock, further including a communication port configured to enable wired communication with a remote device.

In some aspects, the techniques described herein relate to a portable dock, wherein the electronics housing further includes a set of electrical connectors configured to form an electrical connection with a corresponding set of electrical connectors of the electronic key retention device when the portable dock is inserted into the electronic key retention device.

In accordance with one aspect, an electronic key retention device for storing a portable dock for an electronic key is disclosed. The electronic key retention device can include a locking device configured to move between a locked position and an unlocked position. The electronic key retention device can include an actuator associated with the locking device and the actuator can operate the locking device to move between the locked position and the unlocked position. The electronic key retention device can include a receiving portion configured to receive and couple with a portable dock. The portable dock can include a key holder, a base, and a plurality of pins. The key holder can move between a closed position and an open position. While the receiving portion is coupled with the portable dock, and in response to receiving a first user input, a door of the portable dock can move from the closed position to the open position. And in response to receiving a second user input, the actuator can cause the locking device to move from the locked position to the unlocked position.

The retention device may be installed in a vehicle. The retention device may draw power from the vehicle when the vehicle is running. The retention device may not draw power from the vehicle when the vehicle is not running. The portable dock may wirelessly communicate with a remote server via the retention device and the vehicle. The portable dock may include a wireless communication device configured to establish a wireless connection using a wireless communication protocol and allow the portable dock to wirelessly communicate with remote devices. The wireless communication protocol may be a short-distance wireless communication protocol. The portable dock may include a communication port that can enable wired communication between the portable dock and remote devices.

The locking device comprises an arm. The arm of the locking device may translate along an axis between the locked position and the unlocked position. The axis may be defined by a width of the retention device.

The receiving portion may include slots corresponding to protrusions of the portable dock. The slots may engage the protrusions to maintain coupling between the receiving portion and the portable dock. The protrusions may be spring-loaded ball detents.

The retention device may include a user interface. The first user input and the second user input may be provided to the retention device via the user interface.

The retention device may include a sensory indicator that can display an indicator based at least in part on a configuration of the locking mechanism.

In accordance with another aspect, a portable dock for an electronic key retention device for a vehicle is disclosed. The portable dock can receive and store the electronic key. The portable dock can include a base comprising a plurality of pins, and a key holder that can include a cavity and a slot. The cavity can receive and store the electronic key. The key holder can be hingedly coupled to the base and can move between a closed position and an open position. At least a portion of the plurality of pins can be positioned within the cavity of the key holder when the key holder is in the closed position. The plurality of pins can be removed from the cavity of the key holder when the key holder is in the open position.

The key holder may include an opening configured to engage an arm of a locking mechanism of a key retention device.

The base may include a detent that can engage a corresponding slot of a key retention device to improve coupling between the portable dock and the key retention device. The detent may be a spring-loaded ball detent. The base can include a detent configured to engage a corresponding opening of the key holder to improve coupling between the base and the key holder.

The base can include a finger that, when the key holder is in the closed position, can extend to cover at least a portion of an opening for the cavity. The finger can position an electronic key in the cavity as the key holder moves from the open position to the closed position.

The portable dock may include a wireless communication device that can establish a wireless connection using a wireless communication protocol and allow the portable dock to wirelessly communicate with remote devices. The wireless communication protocol can be a short-distance wireless communication protocol. The portable dock may include a communication port that can enable wired communication between the portable dock and remote devices.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are reused to indicate correspondence between referenced elements.

FIGS. 8A-8C illustrate various views of an example portable dock.

DETAILED DESCRIPTION

Figure 1:
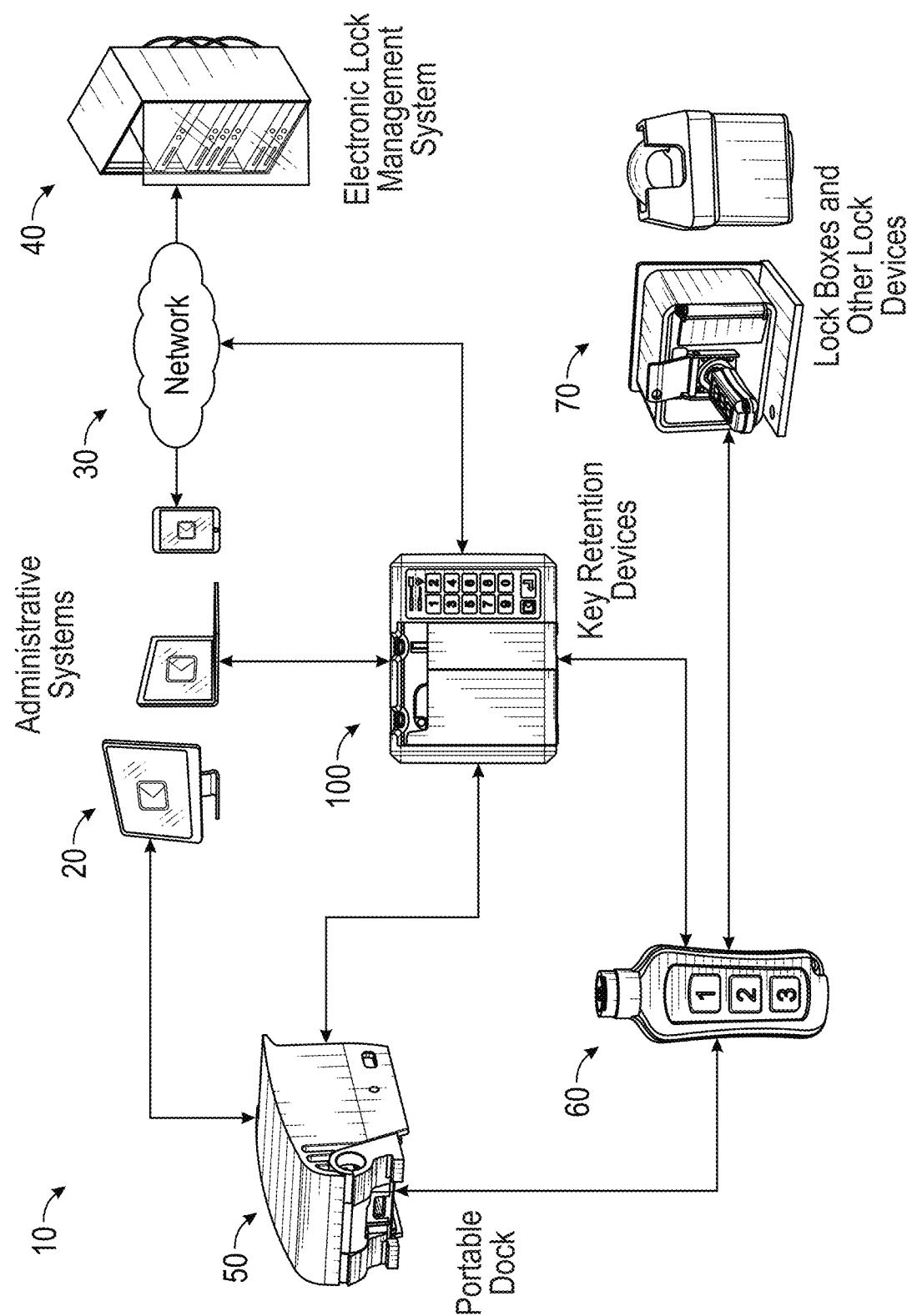
FIG. 1 illustrates an example electronic key management system.

Systems and methods which represent various embodiments and example applications of the present disclosure will now be described with reference to the drawings. In this description, references to "an embodiment," "one embodiment," or the like, mean that the particular feature, function, structure or characteristic being described is included in at least one embodiment of the technique introduced herein and may be included in multiple embodiments. Occurrences of such phrases in this specification do not necessarily all refer to the same embodiment. On the other hand, the embodiments referred to are also not necessarily mutually exclusive.

The present application generally relates to a key retention system that includes a portable dock that can be removed from the key retention system and that stores a key (e.g., an electronic key or a mechanical key). Embodiments of the key, and in particular an electronic key, that can be used with one or more embodiments disclosed herein are described in U.S. Pat. Nos. 10,890,015 and 9,041,510, each of which are hereby incorporated by reference herein in its entirety and for all purposes.

Electronic keys can include a number of credentials and can be used to provide access to electronic locks. For people who spend a lot of time on the road in a vehicle, it may be difficult to charge or update a configuration or modify a setting of an electronic key. As such, there is a need to provide an electronic key retention device for vehicles that can serve as a communication hub for electronic keys. In addition, there is a need for a dock that can easily be removed from the electronic key retention device and that can allow users to easily connect an electronic key to personal computing devices (for example, a smart phone, a tablet, a desktop computer, a laptop computer, and the like) and a key retention device for vehicular use. Further, the ability to remove the electronic key from the key retention device can improve security as the electronic key can be removed from the vehicle when the vehicle will be unattended. Even when the electronic key is configured such that it is unusable if accessed by an unauthorized user, a malicious individual may not be aware of the futility of stealing the electronic key and may attempt to break into a vehicle to steal it if present. Thus, the ability to decouple and remove a dock that stores the electronic key from the key retention system or device may improve both key security and vehicle security.

Although much of the present disclosure describes an electronic key retention device that may be non-removably attached to a vehicle, it should be understood that the electronic key retention device may be attached to other structures, such as walls, buildings, gates, or other locations where secure access to an electronic key may be desired. Further, although the electronic key retention device is designed to be attached to a structure in a manner such that the electronic key retention device is not removable or not easily removable, in some implementations, it may be possible to remove the electronic key retention device, such as by unbolting the electronic key retention device form the structure. In other embodiments, the electronic key retention device may be designed to be irremovable from a structure once installed. In some such cases, the electronic key retention device may only be removed by damaging the device or the structure.

FIG. 1 illustrates an example key management system 10. The electronic key management system 10 represents an example environment for using the electronic keys and locks. In the key management system 10 shown, there are electronic keys 60, key retention devices 100, lock boxes and other lock devices 70 (such as padlocks), docking stations 50, administrative systems 20, an electronic lock management system 40, and a network 30.

The electronic key 60 can include any type of electronic key that can be used to lock/unlock an electronic lock 70. Further, the electronic key 60 may establish a data and/or power connection with an electronic lock 70, or other device, such as the key retention device 100.

The key retention device 100 can secure both the electronic key 60 and/or a mechanical key. The key retention device 100 may be installed in an emergency responder's vehicle, such as a fire truck, ambulance, or police car. In some embodiments, the key retention device 100 may be installed in such a manner that it is not removable or not easily removable from the vehicle. For example, the key retention device 100 may be bolted, welded, or otherwise securely fastened to the vehicle. When a user enters a code into an electronic keypad on the key retention device 100, the key retention device 100 can release the mechanical and/or electronic key for usage. In some embodiments, the code may be entered using an alternative user interface. Further, the user interface may be displayed on and interacted with via another electronic device (e.g., a smartphone) in electronic communication with the key retention device 100.

The docking station 50 may have a similar functionality as the key retention device 100, including receiving data from the electronic key 60 and transmitting the data over the network 30 to one or more administrative systems 20 and/or directly to the electronic lock management system 40. Further, both the key retention device 100 and the docking station 50 can charge the electronic key 60 and can be used to program the electronic key 60. In some embodiments, the docking station 50 may be a portable docking station that can be inserted into and/or removed from the key retention device 100. In some embodiments, the code used to release the electronic key 60 from the key retention device 100 may instead or additionally be used to release the portable dock 50 from the key retention device 100. Alternatively, a separate or different code may be used to remove the portable code 50 from the key retention device 100 than the code used to access the electronic key 60. Advantageously, by have two separate codes, a user who is not authorized to access the electronic key may be permitted to remove the portable dock 50 from a vehicle. For example, a user who is not permitted to use the electronic key may be permitted to remove the portable dock 50 containing the key 60 from a vehicle for charging purposes or to secure the electronic key in a safe location external to the vehicle (e.g., a safe) when, for example, the vehicle is not in use.

The electronic key 60 can communicate electronically with the key retention device 100 to transmit audit data regarding electronic key usage with a locking device 70. In turn, the key retention device 100 can upload the audit data to one or more administrative systems 20 over a wired or wireless connection. The administrative systems 20 may be personal computers, desktops, laptops, tablets, smartphones, or the like operated by one or more administrative users (or simply, "administrators"). The administrative systems 20 can include software, which may be a standalone application or web application, that submits the audit data to an electronic lock management system 40 over the network 30. The standalone application or web application can enable the administrators to view and analyze the audit data to identify irregularities and the like. In addition, the key retention devices 100 may transmit the audit data directly to the electronic lock management system 40 over the network 30, for example, over a wireless connection. In some cases, the electronic key 60 may itself transmit the audit data to an administrative system 20 and/or an electronic lock management system 40 over a wired or wireless connection. For example, the electronic key 60 may include a radio frequency transmitter or a near field communication device that enables the electronic key 60 to communicate audit data to the administrative system 20.

The electronic lock management system 40 can include software implemented on one or more servers, physical or virtual, which may be geographically dispersed in one or more data centers or geographically co-located. The electronic lock management system 40 can be implemented in a cloud computing platform, such as a platform as a service (PaaS), infrastructure as a service (IaaS), or software as a service (SaaS) platform, examples of which include Microsoft Azure™ and Amazon AWS™. The electronic lock management system 40 can store and analyze audit data received from a plurality of electronic keys 60, key retention devices 100, and/or docking stations 50. The electronic lock management system 40 can provide the above-referenced web application, which may be accessed using a browser of the administrative system 20. The web application may include one or more user interfaces that output the audit data in various forms, such as tables, graphs, charts, or the like The network 30 can include a wireless and/or wired network, a local area network (LAN), a wide area network (WAN), the Internet, an intranet, combinations of the same, or the like. Additional information regarding the key management system 10 and its aspects and features can be founded in U.S. Pat. No. 10,890,015, which is incorporated by reference above.

Figure 2A:
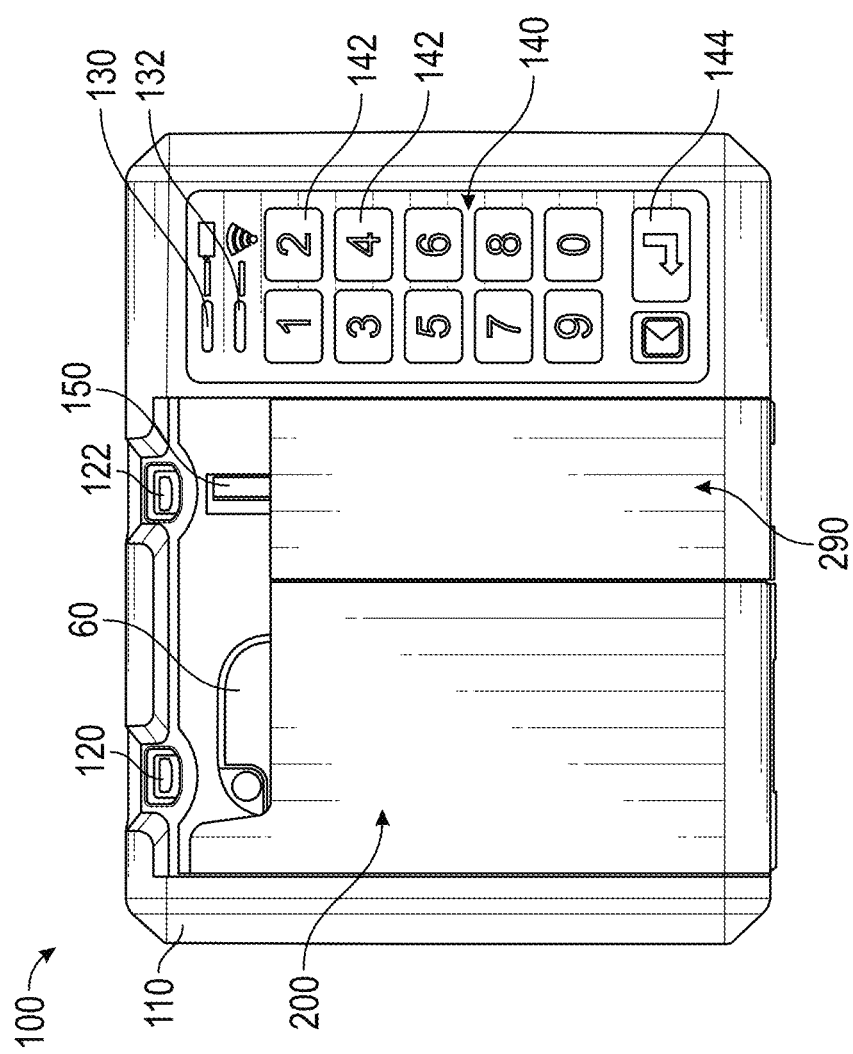
FIGS. 2A and 2B illustrate various views of an example key retention device with a portable dock.
Figure 2B:
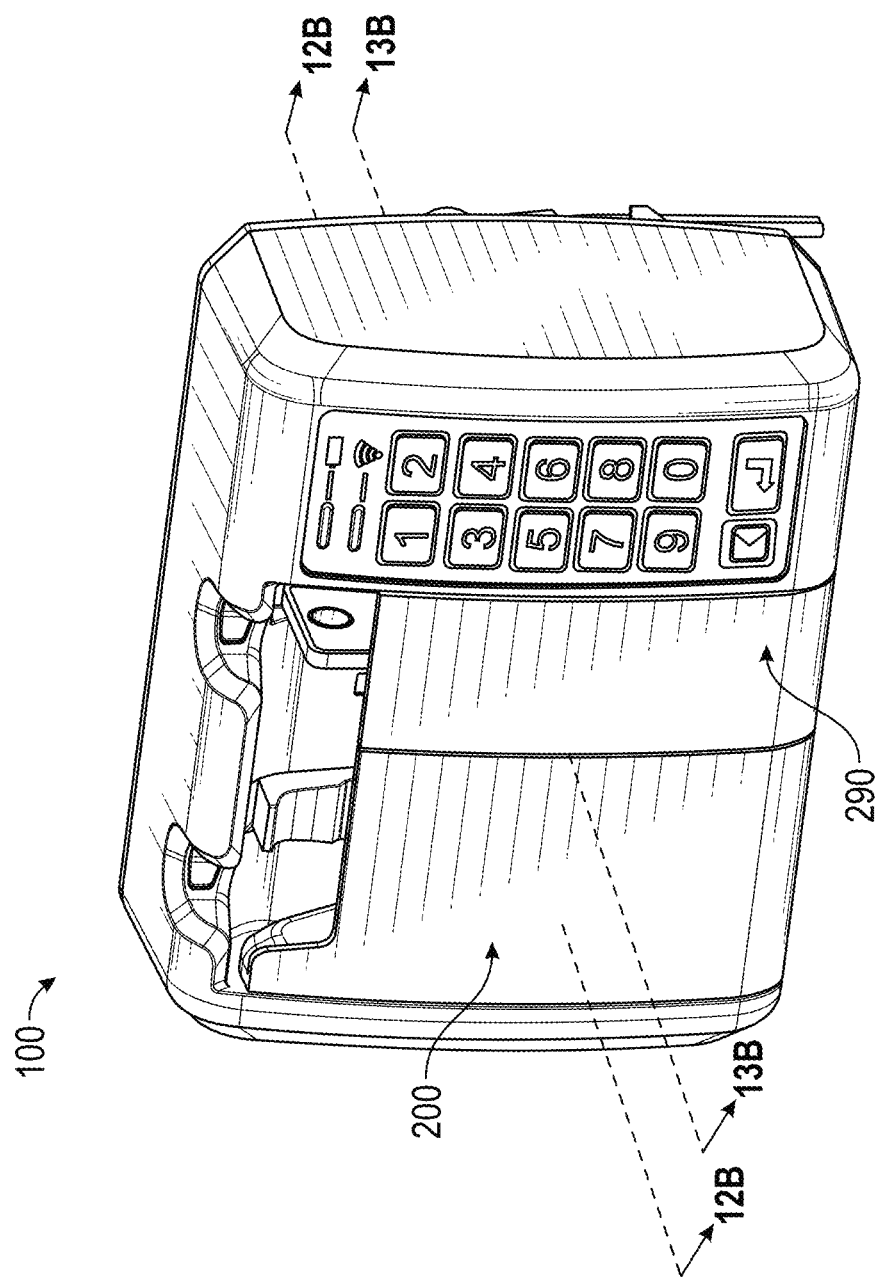

FIGS. 2A and 2B illustrate the key retention device 100. The key retention device 100 can be installed in a vehicle and can store or house the electronic key 60 as described herein. The electronic key 60 may be stored in a portable dock 200 that may be inserted into the key retention device 100. Further, in some cases, the key retention device 100 can store or house a mechanical key 150. The key retention device 100 can include a body 110 or housing that can include a first lock indicator 120, a battery status indicator 130, a communication indicator 132, and a user interface 140.

When installed in the vehicle, the key retention device 100 may draw power from the vehicle. In some cases, the key retention device 100 may draw power at any time from the vehicle. In other cases, the key retention device 100 may only draw power when the vehicle is turned on or is running. In some cases, the key retention device 100 may draw power from the vehicle to operate one or more features of the key retention device 100. In other cases, the key retention device 100 may draw power from the vehicle to charge a battery of the key retention device 100. The battery may power operation of the key retention device 100, which may include controlling access to the portable dock 200, programming the electronic key 60, transmitting data and/or commands (e.g., audit trail data) to or from the electronic key 60, etc.

The battery status indicator 130 can indicate charge levels of the electronic key 60 coupled to the key retention device 100. The battery status indicator 130 can use different colors to indicate various charge levels of the electronic key 60. For example, the battery status indicator 130 may be red if the charge level of the electronic key 60 is low or below a predetermined threshold level. In another example, the battery status indicator 130 may be green if the charge level of the electronic key 60 is high or above a predetermined threshold level. In some implementations, the battery status indicator 130 can display a numerical value (for example, "65%") to indicate a charge level of the electronic key 60. In some implementations, the battery status indicator 130 may indicate charge levels or status of a battery (or batteries) of the key retention device 100, or other devices connected to the key retention device 100. In some embodiments, the key retention device 100 may include one or more other status indicators configured to output an indication of a status of a configuration of the key retention device 100 and/or the portable dock 200. For example, the status indicators may indicate whether the portable dock 200 is inserted into the key retention device 100, whether the portable dock 200 is open, closed, or locked, whether the key retention device 100 is locked, a communication status of the key retention device 100 and/or portable dock 200, etc. Further the status indicators may be visual, audio, haptic, or any other type of status indicator.

The communication indicator 132 can indicate a communication or signal strength or a communication status between the key retention device 100 and a remote device (for example, a remote server, the network 30, an administrative system 20, an electronic lock management system 40, or the portable dock 200). In cases where the communication indicator 132 indicates a signal strength with the portable dock 200, the communication indicator 132 may indicate a signal strength regardless of whether the portable dock 200 is docked with the key retention device 100 or, in some cases, only when the portable dock 200 is removed from the key retention device 100. In cases where the portable dock 200 is beyond the communication range of the key retention device 100, the communication indicator 132 may indicate a lack of connection or may have no indication implying a lack of connection to the portable dock 200. A color may be used to indicate a magnitude or level of the signal strength. For example, the communication indicator 132 can be red if the signal strength is low or below a predetermined threshold level. In another example, the battery status indicator 130 may be green if the communication strength is high or above a predetermined threshold level.

One or more of the key retention device 100 or the portable dock 200 may have a transceiver. The transceiver may enable the key retention device 100 to communicate with the portable dock 200. Additionally, or alternatively, the transceiver may enable the key retention device 100 and/or the portable dock 200 to communicate with a remote system or a remote device (e.g., the remote device 1430 illustrated in FIG. 14).

The user interface 140 can include a keypad 142 that allows a user to provide user input for the key retention device 100. The keypad 142 can be numerical, alphabetical, or alpha-numerical. Further, it should be understood that the keypad 142 is one non-limiting example user interface element that may enable a user to interact with the key retention device 100. The user interface 140 can include one or more alternative or additional user interface elements to facilitate interaction with the key retention device 100. For example, the user interface 140 may include a touchscreen interface, a dial, a knob, a button, a biometric interface (e.g., a fingerprint sensor, an iris scanner, a face scanner, etc.), or any other type of user interface element that may be used to authenticate a user, provide access to the key retention device 100, or otherwise enable a user to interact with the key retention device 100.

As another example user interface element, the user interface 140 can include an execute button 144 that, when actuated or interacted with, can cause the key retention device 100 to acknowledge user input provide via the user interface 140 (for example, using the keypad 142). A user input may be in a form of actuating a series of keys in a specific order (for example, a personally identifiable number, symbols, alphanumeric characters, and the like).

In some implementations, the key retention device 100 can receive a portable dock 200 for storing the electronic key 60. The portable dock 200 can include one or more of the embodiments previously described with respect to the portable dock 50. Additionally, or alternatively, the key retention device 100 can include a holder 290 for storing a mechanical key 150 and a second lock indicator 122. The holder 290 for the mechanical key may or may not be removable from the key retention device 100. The portable dock 200 for storing the electronic key 60 may be removable from the key retention device 100.

The first lock indicator 120 can generate and display an indicator based on a state of a locking system 600 (see FIGS. 6-7) of the key retention device 100. The indicator may be auditory, visual, or both. For example, the first lock indicator 120 can be red when the locking system 600 is in a locked position. When in the locked position, the portable dock 200 and/or the electronic key 60 cannot or should not be removed from the key retention device 100. In another example, the first lock indicator 120 can be green when the locking system 600 is in an unlocked position and when the portable dock 200 and/or the electronic key 60 can be safely removed from the key retention device 100. Of course, other colors and/or auditory indicators may be used. The second lock state indicator 122, similar to the first lock state indicator 120, can generate an indicator that can enable a user to know when the mechanical key 150, or a portable dock that stores the mechanical key 150, is removable from the key retention device 100 as described herein. In some cases, the lock indicator may include haptic responses. For example, the key retention device 100 may vibrate when the electronic key 60 is locked into place. Other types of indictors or messages (for example, "READY") can be used to show the state of the locking system 600.

Figure 3B:
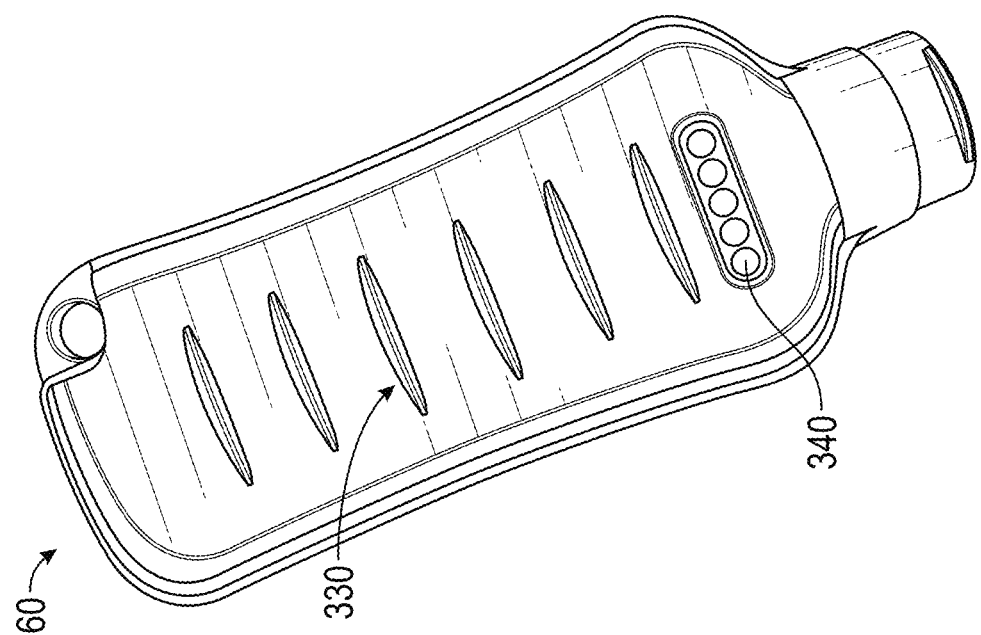
FIGS. 3A and 3B illustrate various views of an electronic key.
Figure 3A:
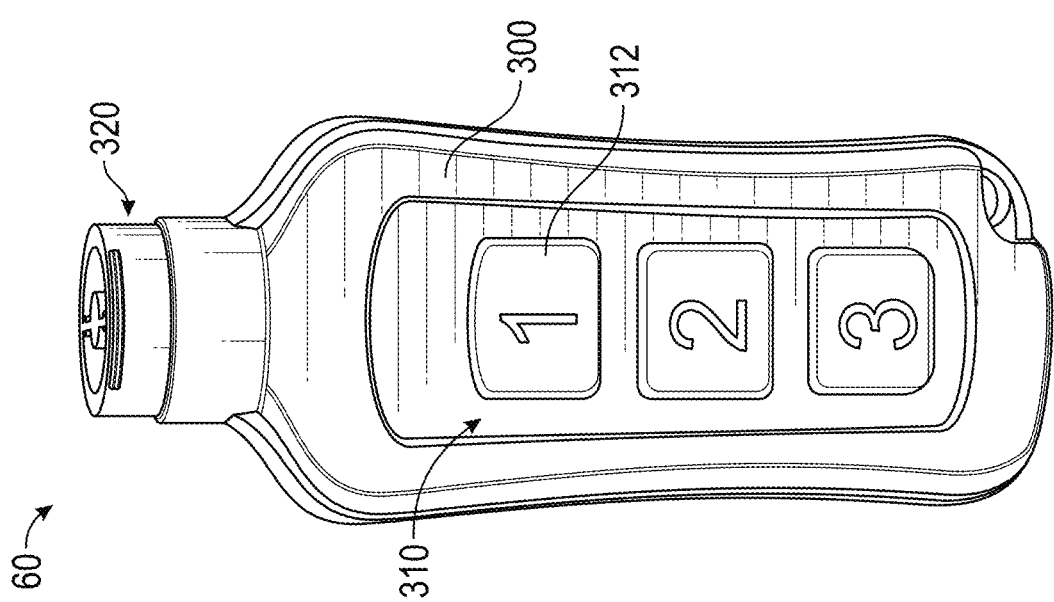

FIGS. 3A and 3B illustrate one non-limiting embodiment of the electronic key 60. The electronic key 60 can include a body 300, a user interface 310, a mating portion 320, and electrical contacts 340. The user interface 310 can include one or more user interface elements, such as a keypad 312, that users can use to provide user input to the electronic key 60. The mating portion 320 can mate with a corresponding connector or mating portion of, for example, an electronic lock. The electrical contacts 340 can come in contact with corresponding electrical contacts (for example, pins) to allow the electronic key 60 to communicate with, for example, the portable dock 200 and other devices connected (wired or wirelessly) to the portable dock 200. In some implementations, the body 300 of the electronic key 60 can include protrusions 330 that can facilitate user's grip of the electronic key 60 during use. Additional information regarding the electronic key 60 can be found in U.S. Pat. Nos. 10,890,015 and 9,041,510 previously incorporated by reference above.

Figure 4B:
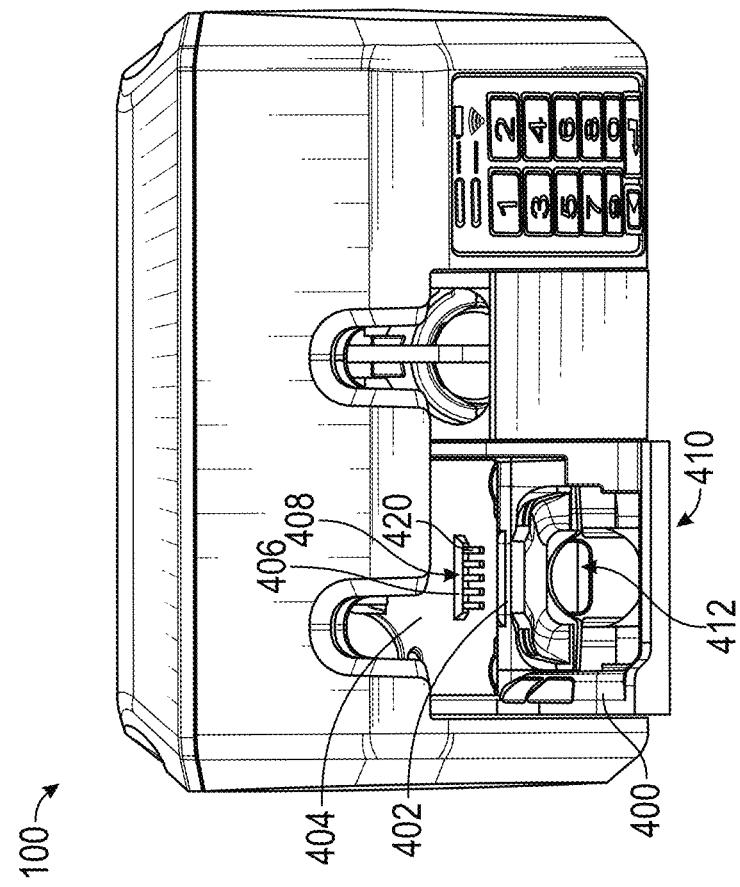
FIGS. 4A and 4B illustrate various view of an example key retention device of FIGS. 2A and 2B, with a portable dock in an open configuration.
Figure 4A:
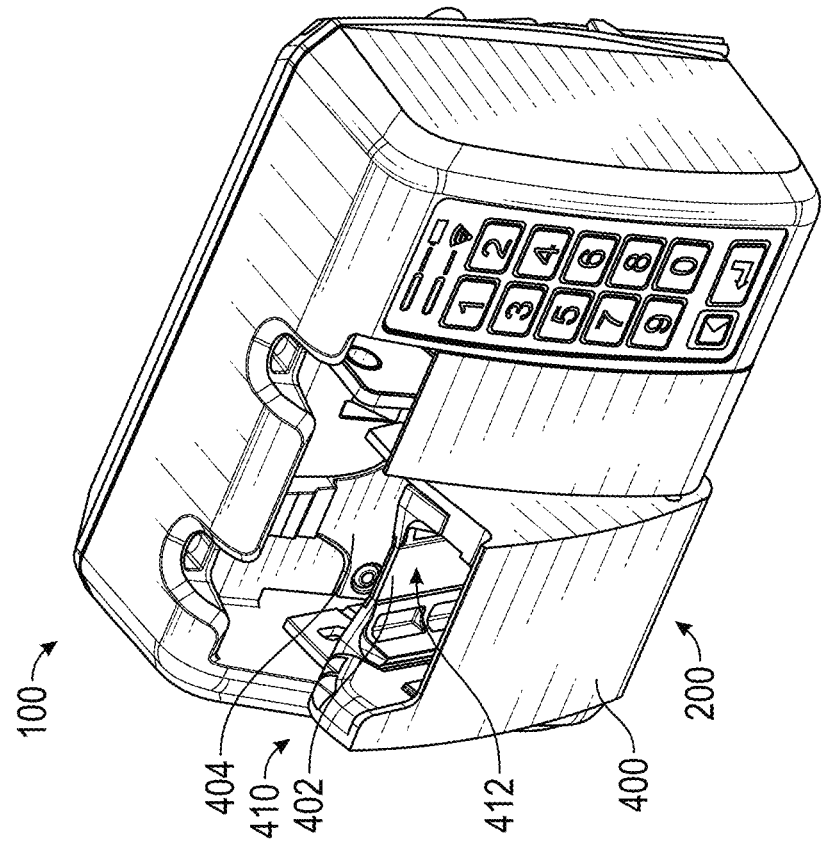

FIGS. 4A and 4B illustrate the key retention device 100 with the portable dock 200 stowed. As shown in FIGS. 4A and 4B, the portable dock 200 can include a base 404 and a key holder 410. The key holder 410 can be hingedly coupled via a hinge, or rotatably connected by the hinge, a dowel, a screw, or other connection mechanism to the base 404 such that the key holder 410 can move away from the base 404 in a first rotational direction and move towards the base 404 in a second rotational direction about an axis (for example, defined by a pin 920 shown in FIG. 9). It should be understood that other connection mechanisms may be used to connect the portable dock 200 to the key retention device 100. For example, a snapping or latching mechanism may be used to connect the portable dock 200 to the key retention device 100. The key holder 410 can include a cavity 412 that can be dimensioned to receive and store the electronic key 60.

Figure 9:
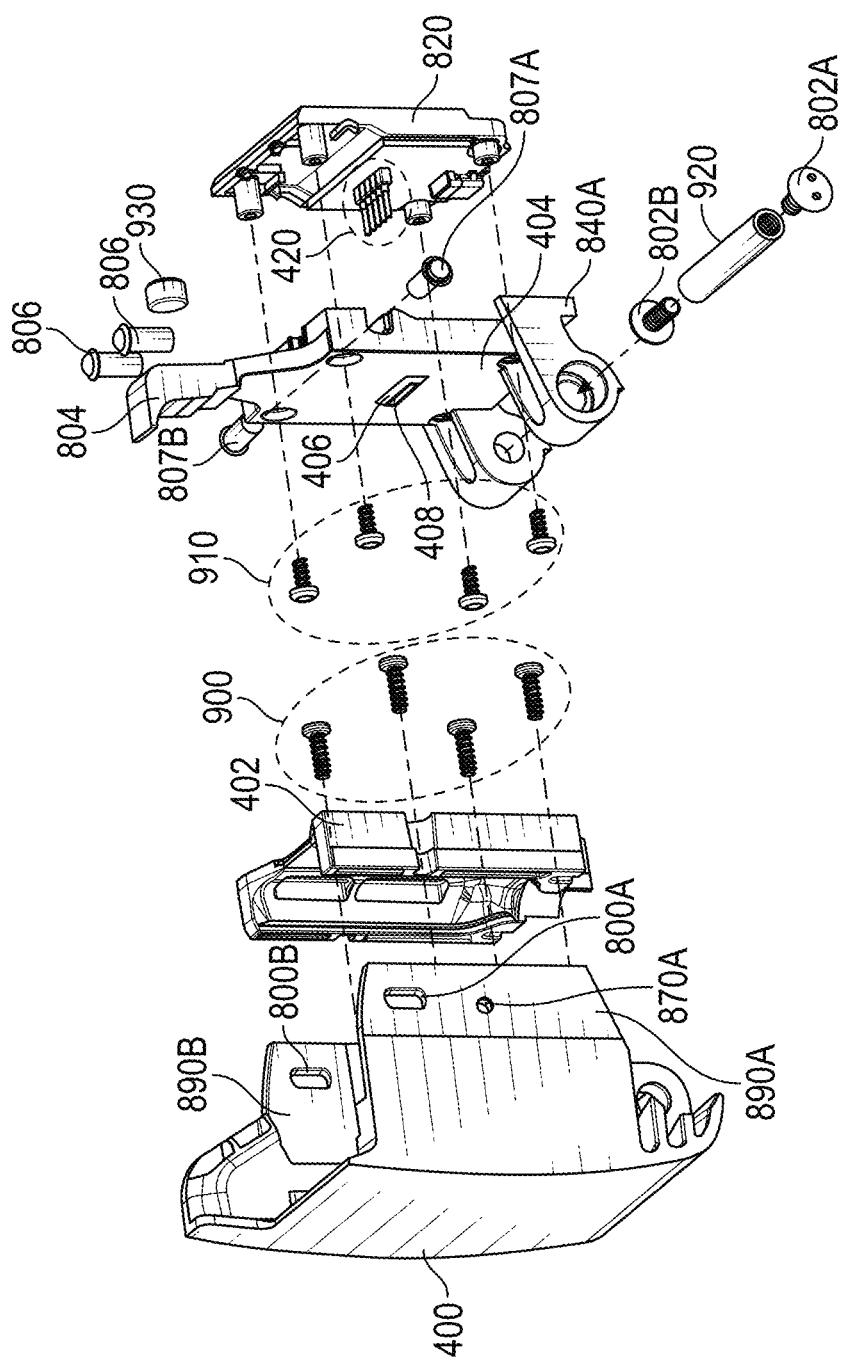
FIG. 9 illustrates a perspective, exploded view of the example portable dock of FIGS. 8A-8C.

The key holder 410 can include a front cover 400 and a rear cover 402. The front cover 400 and the rear cover 402 can be attached to each other and form the cavity 412. The front cover 400 and the rear cover 402 can be fixedly attached to each other using screws (for example, screws 900 as shown in FIG. 9) or any other type of securing mechanism. Alternatively, the front cover 400 and the rear cover 402 may be formed from a single or uniform piece of material. The cavity 412 can be dimensioned such that when the electronic key 60 is inserted into the cavity 412, a rear portion (for example, a portion that is opposite from the mating portion 320) may stick out (for example, not positioned within the cavity 412). A user can clasp or grab onto the rear portion to remove the electronic key 60 from the cavity 412 of the key holder 410. It should be understood that any directional terms used are to simplify description and not to limit the present disclosure. For example, the front cover 400 may be considered the rear of the key holder 410 or a side of the key holder 410, etc.

The key holder 410 can move between a first position (for example, a closed position) and a second position (for example, an open position). When in the first position, the key holder 410 may be positioned at a predetermined distance away from the base 404. When in the second position, the key holder 410 may be positioned adjacent to the base 404.

In some implementations, the key holder 410 may not be hingedly coupled to the base 404. For example, the key holder 410 may simply move a predetermined distance away from the base 404 to allow a user to place the electronic key 60 into the cavity 412 of the key holder 410.

Figure 11B:
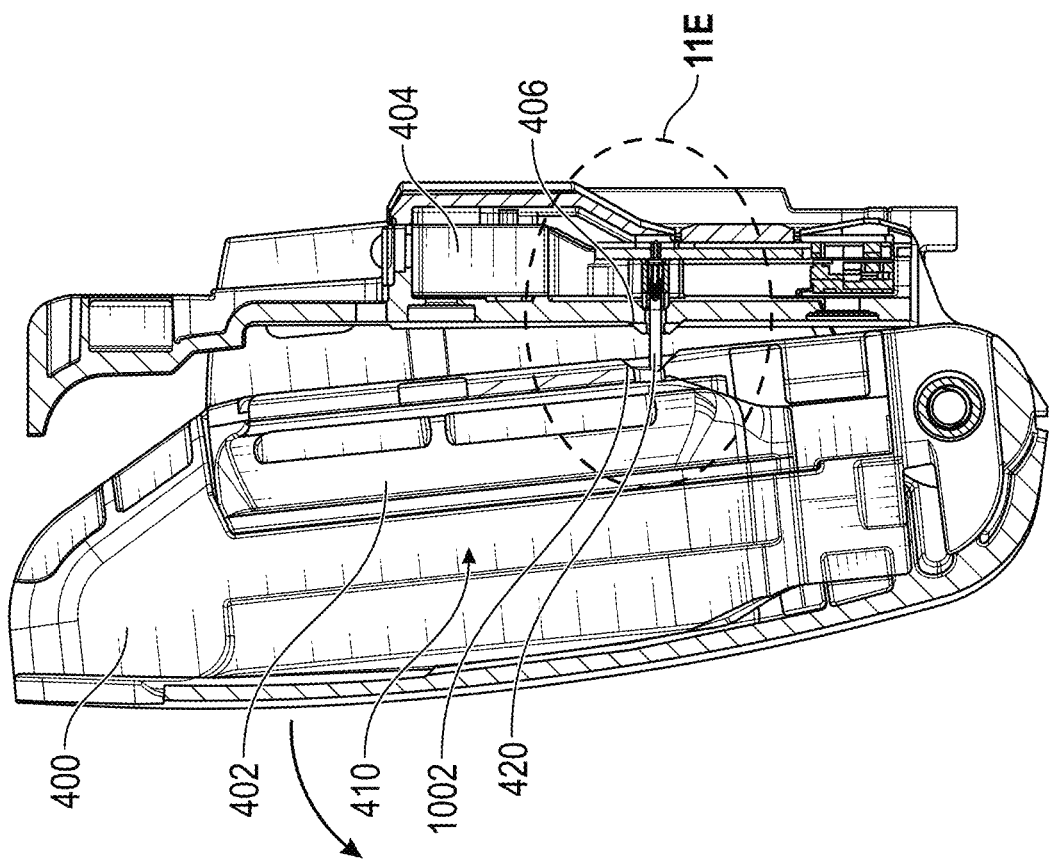
FIGS. 11A-11D illustrate various cross-sectional views of the example portable dock of FIGS. 8A-8C.
Figure 11A:
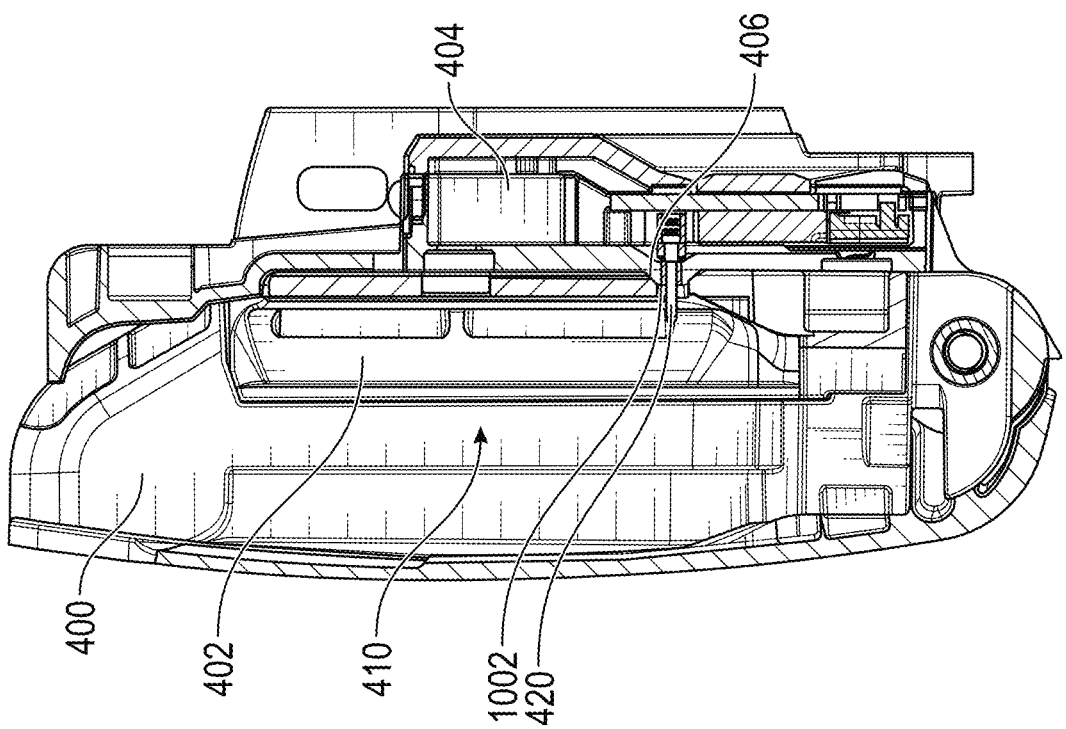
Figure 11D:
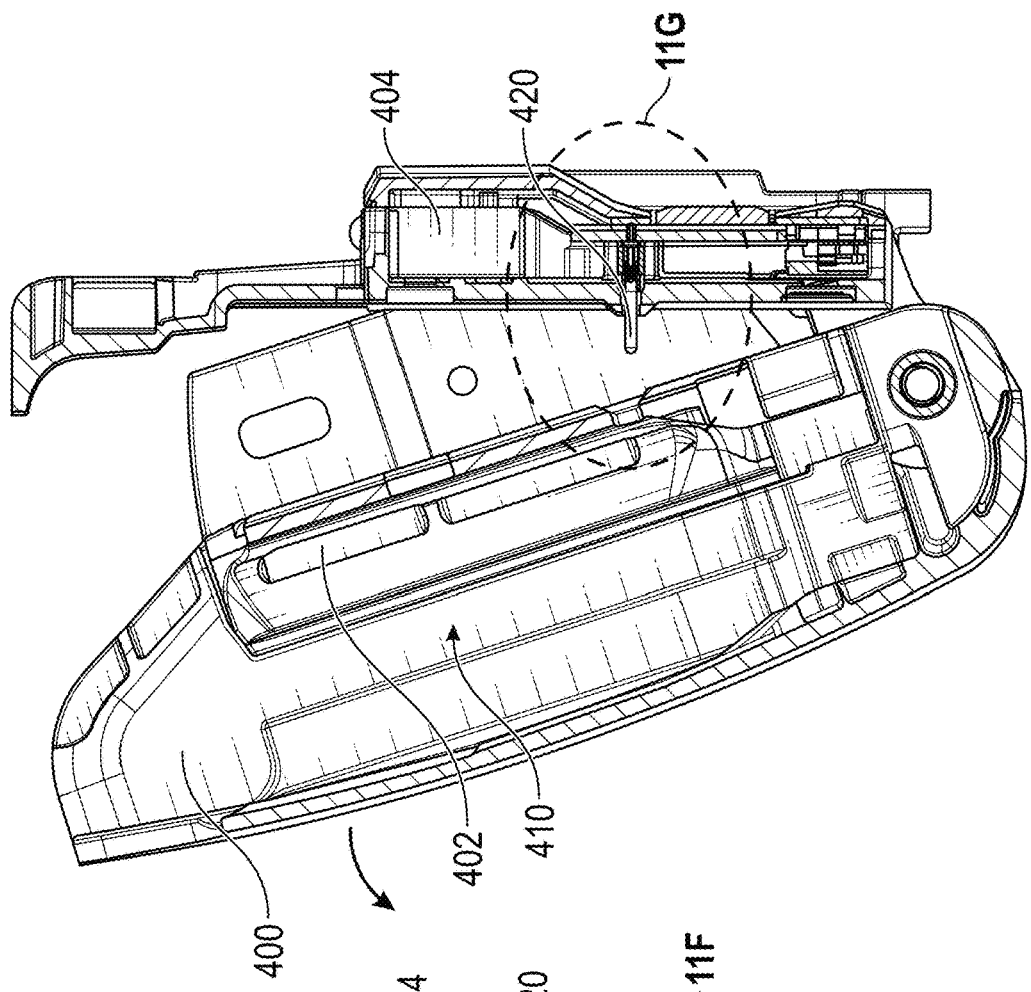
Figure 11C:
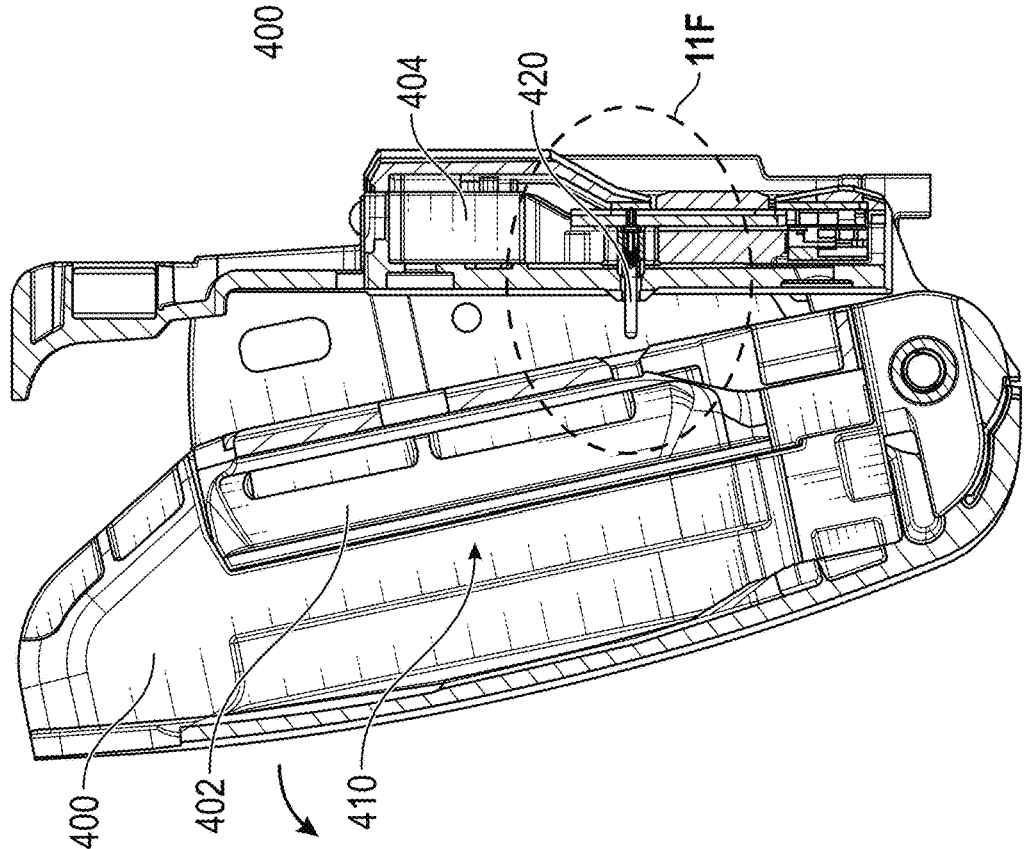
Figure 11E:
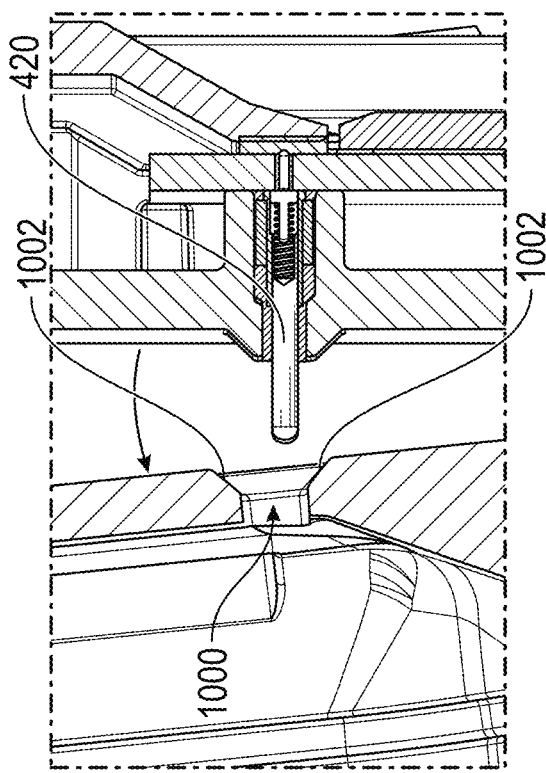
FIG. 11E illustrates a partial, enlarged view of a section of the cross-sectional view of FIG. 11B.
Figure 11F:
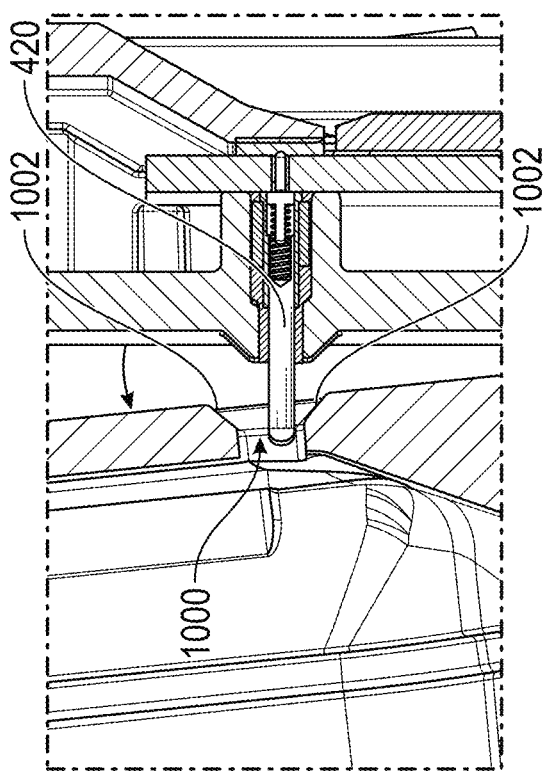
FIG. 11F illustrates a partial, enlarged view of a section of the cross-sectional view of FIG. 11C.
Figure 11G:
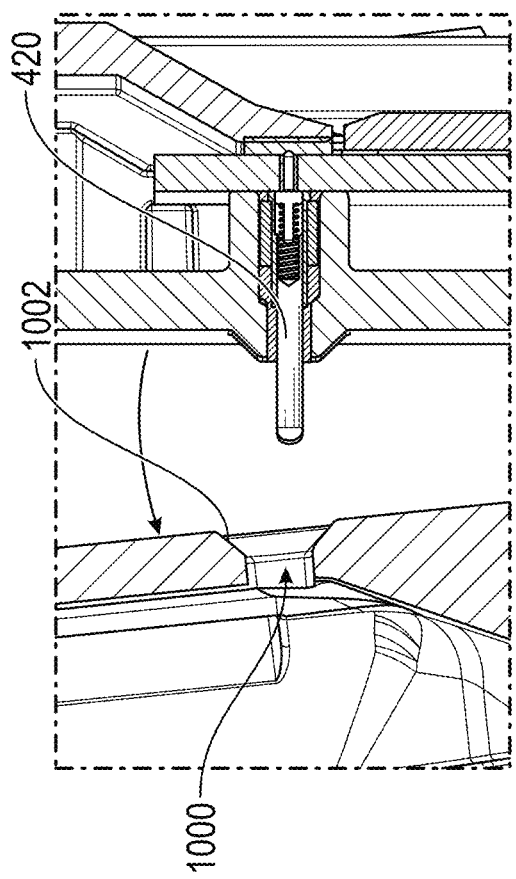
FIG. 11G illustrates a partial, enlarged view of a section of the cross-sectional view of FIG. 11D.

The base 404 can include a slot 408 for receiving pins 420. The pins 420 can extend through the slot 408 and towards the cavity 412 of the key holder 410. In some implementations, the slot 408 can be raised and include edges 406. The edges 406 can be tapered such that the thickness of the edges 406 can decrease as the edges 406 extend away from the base 404. The edges 406 can be dimensioned and shaped to correspond to edges 1002 of a slot 1000 of the rear cover 402 as shown in, for example, FIGS. 11A and 11B.

When the key holder 410 is in its first position (for example, the closed position), distal portions of the pins 420 can extend into the cavity 412 by extending through a slot 1000 (see FIG. 10B) of the rear cover 402 of the key holder 410. When the key holder 410 is in its second position (for example, the open position), the pins 420 may be positioned away from the key holder 410 such that the distal portions of the pins 420 may no longer extend into the cavity 412 via the slot 1000 of the rear cover 402. This feature can be advantageous in preventing damage to the pins 420. When the key holder 410 is in the second position (for example, the open position), a user may insert the electronic key 60 into the cavity 412. By allowing the pins 420 to move away from the key holder 410 such that the distal portions of the pins 420 may no longer extend into the cavity 412, the electronic key 60 may not contact the pins 420 when being inserted into the cavity 412. In some cases, when in the closed position, a door (e.g., the front cover 400) or other physical element of the key holder 410 may be positioned in a manner that restricts or prevents insertion or removal of the electronic key 60. In contrast, when in the open position, the door or other physical element of the key holder 410 may be positioned in a manner that supports or enables insertion or removal of the electronic key 60.

In some implementations, the pins 420 are spring-loaded. As such, when the key holder 410 storing the electronic key 60 is moved from the open position to the closed position (that is, approximated towards the base 404), the pins 420 contact the electrical contacts 340 of the electronic key 60 and push towards the base 404. The force applied to the pins 420 by the electronic key 60 compresses springs of the pins 420. The compression of the springs can advantageously push the pins 420 against the electrical contacts 340 and improve the contact between the pins 420 and the electrical contacts 340.

When the pins 420 and in contact with the electrical contacts 340, the key retention device 100 can charge the electronic key 60. Further, the key retention device 100 can access data from the electronic key 60 enabling auditing of the electronic key 60 usage. Moreover, the key retention device 100 can program or modify permissions of the electronic key 60.

Figure 5:
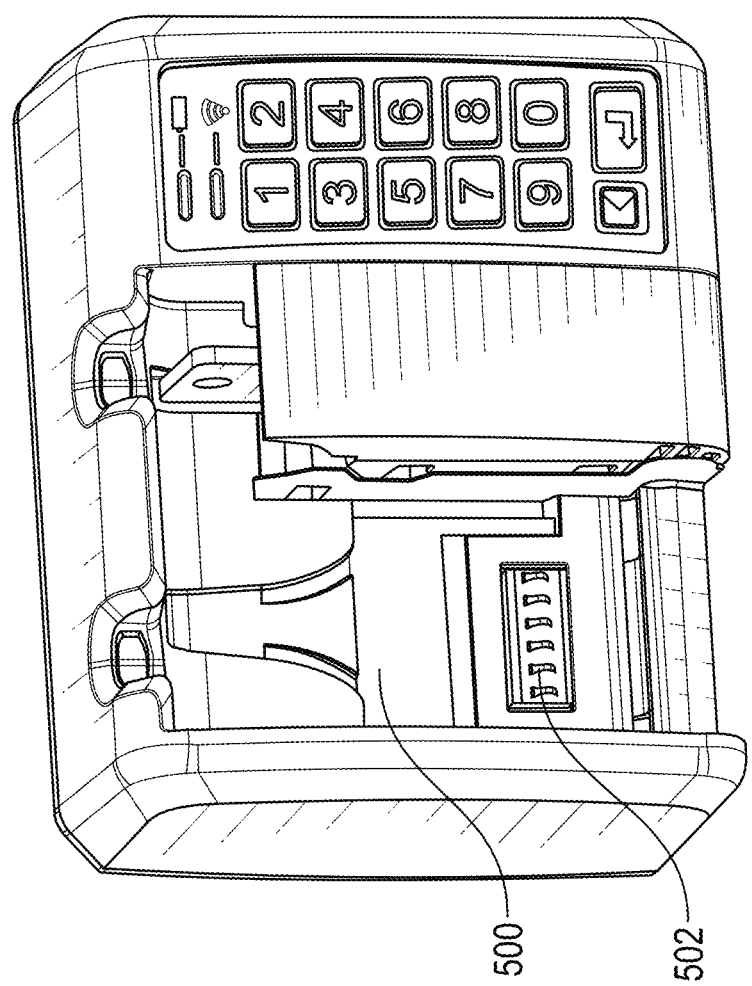
FIG. 5 illustrates the example key retention device of FIGS. 2A and 2B without a portable dock.

FIG. 5 illustrates the key retention device 100 without the portable dock 200. The key retention device 100 can include a receiving portion 500, such as docking seat or other structure, configured to receive and secure the portable dock 200. Accordingly, the portable dock 200 may be removably inserted or attached to the key retention device 100. The receiving portion 500 can include pins 502 that can contact corresponding strips 822 (see FIG. 8B) or other electrical connectors of the portable dock 200. When the portable dock 200 is inserted into the receiving portion 500, the pins 502 and the strips 822 of the portable dock 200 can come in contact to allow transmission of data and/or power between the key retention device 100 and the portable dock 200. In some embodiments, the pins 502 are the pins 420. In some such embodiments, the pins 502 are slotted or fit through a gap or set of holes within the key holder 410 enabling the pins 502 to mate or make contact with the electrical contacts 340 of the electronic key 60. Further, in some such implementations, the strips 822 may be omitted and may be replaced with the gap or holes enabling the pins 502 to contact the electrical contacts 340. It should be understood that other electrical contact mechanisms capable of transferring data or power are possible. For example, the pins 502 and/or strips 822 may be implemented using electrical traces, coupling traces, contact bumps, pins, wires, or any other electrical contact mechanism. Moreover, in some cases, physical contacts may be replaced with wireless communication mechanisms, such as a capacitive or inductive communication system. One non-limiting example of capacitive and inductive data and power transfer is disclosed in U.S. Pat. No. 9,041,510 incorporated by reference above. In some embodiments, the key retention device 100 and the portable dock 200 may implement one or more wireless power standards (e.g., the Qi standard).

Figure 7:
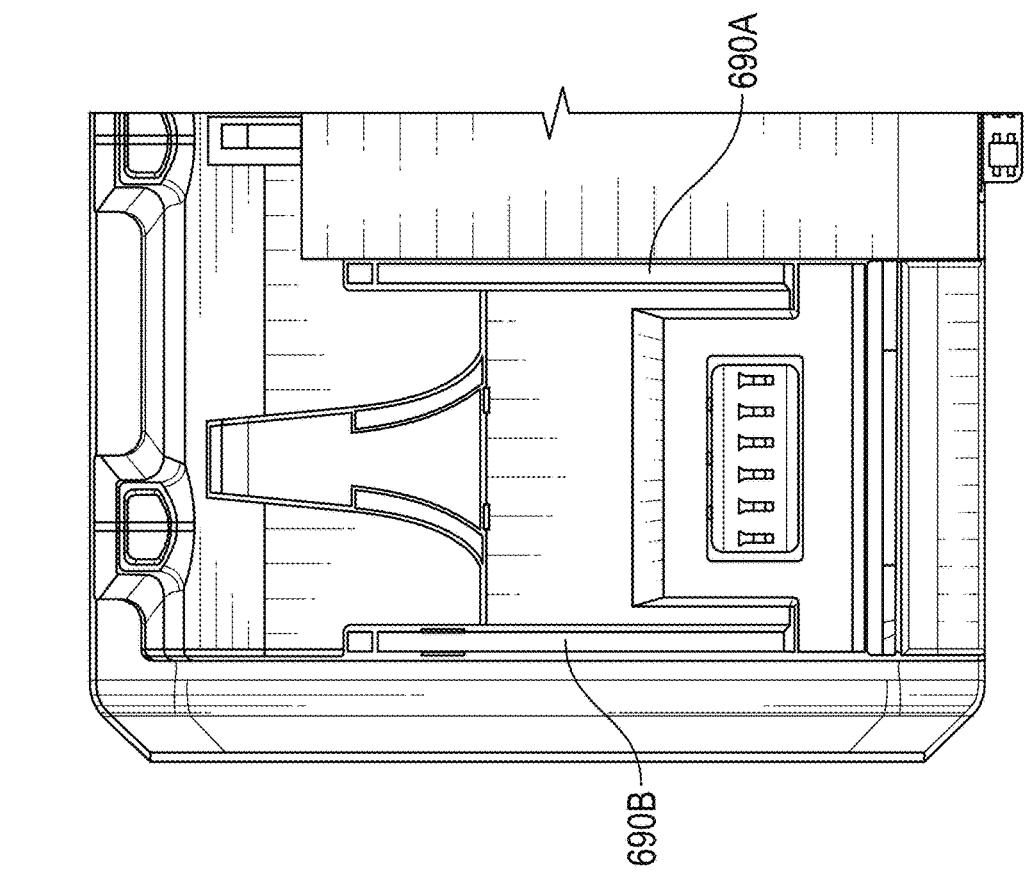
FIGS. 6 and 7 illustrate a locking mechanism of the example key retention device of FIGS. 2A and 2B in a locked state and an unlocked state.
Figure 6:
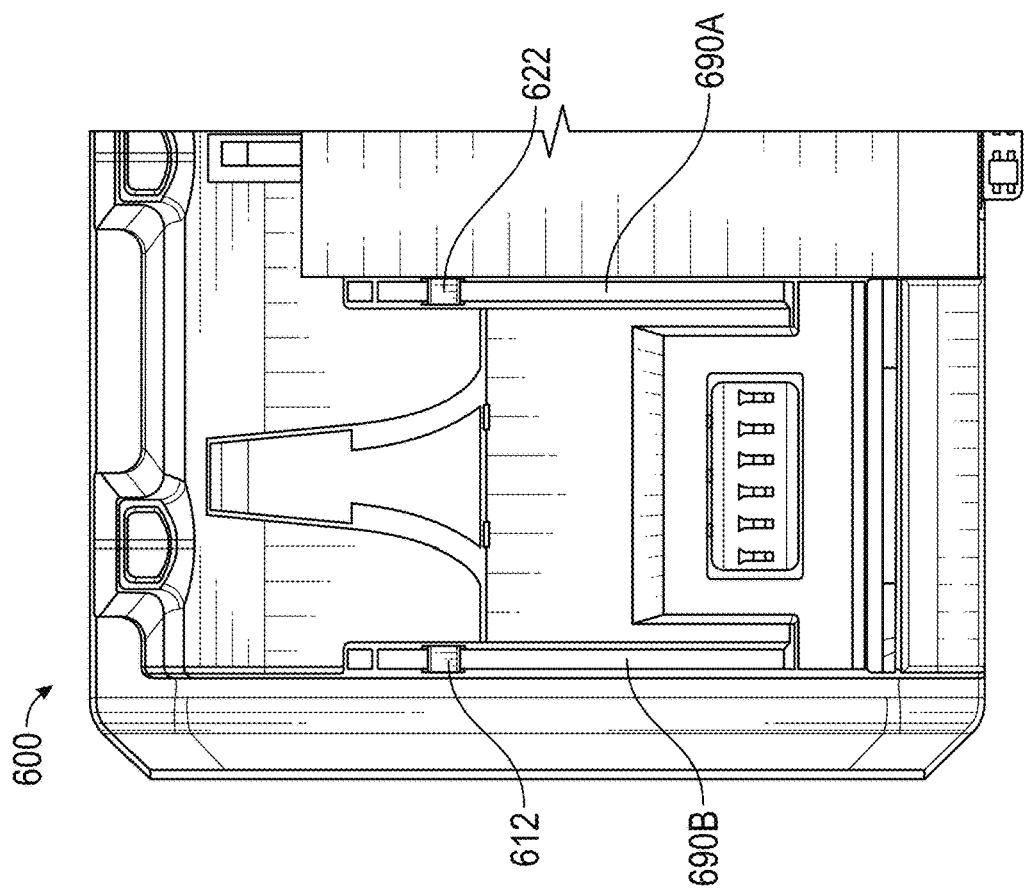

With reference to FIGS. 6-7, an example of the locking system 600, which may be referred to as a portable dock locking system, for the key retention device 100 is described. The receiving portion 500 of the key retention device 100 can include slits 690A, 690B that can receive wings 890A, 890B, respectively, of the front cover 400 of the key holder 410 (see FIG. 8B). The locking system 600 of the key retention device 100 can include arms 612, 622 that can extend through the slits 690B, 690A, respectively. In the example shown in FIG. 6, portions of the arms 612, 622 are shown extending through and across the slits 690B, 690A, respectively. In the example shown in FIG. 7, the arms 612, 622 are retracted and no longer extend through and across the slits 690B, 690A. In some implementations, the locking system 600 may include an actuator that is configured to transition the key retention device 100 from a locked state to an unlocked state, or vice versa, by retracting or extending the arms 612, 622. The actuator may cause the arms 612, 622 to translate along an axis (e.g., a rotational axis) to transition the key retention device 100 from a locked state to an unlocked state, or vice versa, that locks or unlocks the portable dock 200 such that the portable dock 200 remains coupled to the key retention device 100 or can be removed from the key retention device 100. In some embodiments, the axis may correspond to the width of the key retention device 100.

Figure 12B:
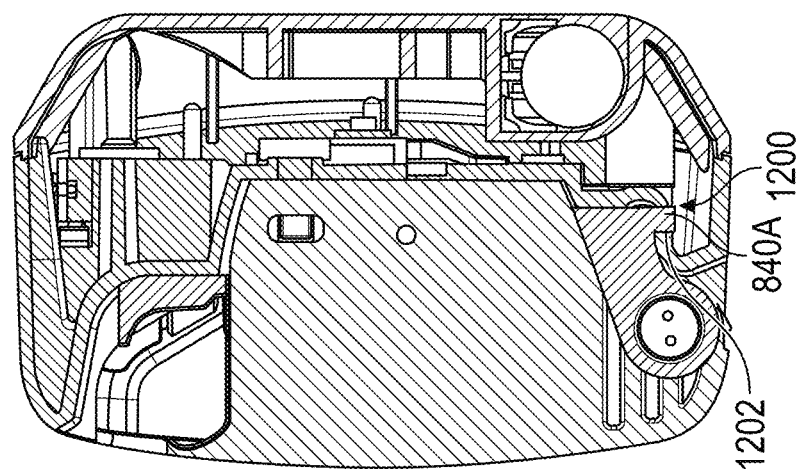
FIG. 12B illustrates a cross-sectional view of the example key retention device of FIGS. 2A and 2B along the lines 12B-12B, showing the example portable dock of FIGS. 8A-8C stowed in the example key retention device of FIGS. 2A and 2B.
Figure 12A:
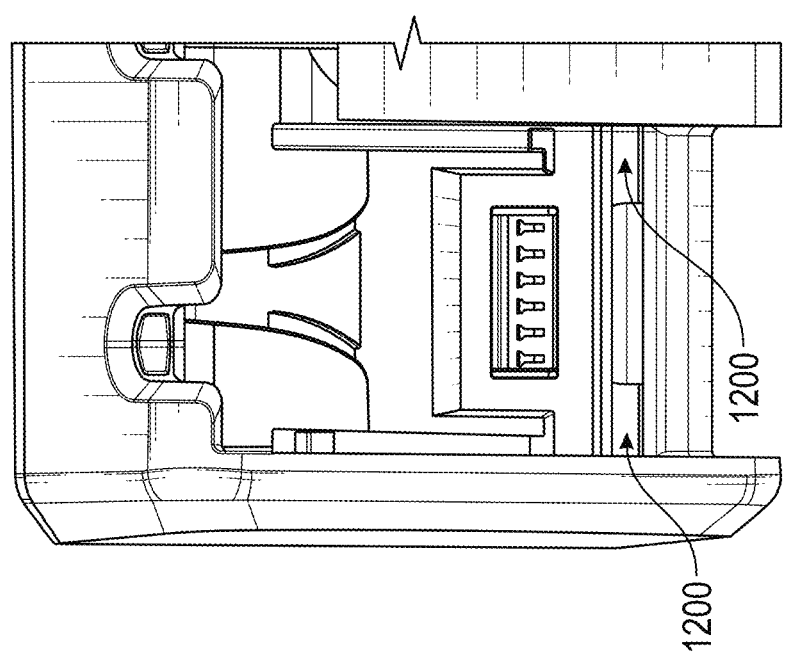
FIG. 12A illustrates example slots formed on a body of the example key retention device of FIGS. 2A and 2B.

In some embodiments, the arms 612, 622 can engage with holes 800A, 800B (illustrated in FIG. 8B) to secure the portable dock 200 to the key retention device 100. In some such cases, the arms 612, 622 may include a securing mechanism (e.g., a finger, clip, or latch) that can engage with the holes 800A, 800B to secure the portable dock 200 to the key retention device 100. Accordingly, the arms 612, 622 may be locking arms that lock or secure the portable dock 200 in place. The locking arms may be retracted in response to a pin or passcode or other authentication mechanism (e.g., biometrics, RFID, etc.). Alternatively, the locking arms may be retracted in response to user input or via a mechanical interface without requiring authentication. When the arms are retracted by the actuator (now shown), the securing mechanism may disengage from the holes 800A, 800B. In some embodiments, the securing mechanism is optional or omitted. In some such cases, the portable dock 200 remains engaged with the key retention device 100 via the fingers 1202 being inserted into the openings 1200 as described with respect to FIG. 12B below. The fingers 1202 may be protrusions that engage with hooks 840A, which may also be a type of protrusion, to help maintain coupling between the portable dock 200 and the receiving portion 500. The receiving portion 500 may be a docking seat configured to accept the portable dock 200 when inserted into the key retention device 100. Alternatively, or in addition, the portable dock 200 may be secured to the key retention device 100 using a magnet 930, or other attachment mechanism, inserted into a hole 810 of the finger 804. The magnet 930 or other attachment mechanism may then engage with a corresponding element in the locking system 600 of the key retention device 100.

The locking mechanism described herein can be actuated by a user input provided via, for example, the user interface 140. For example, a user can provide a user input (for example, a PIN) via the user interface 140 to cause the locking system 600 to unlock the portable dock 200. The user then can either open the key holder to remove the electronic key 60 from the portable dock 200 or remove the portable dock 200 (with the electronic key 60 stored inside). In some embodiments, a different pin or passcode may be used to unlock the electronic key 60 than is used to unlock the portable dock 200 from the key retention device 100. An actuator within the portable dock 200 may cause the portable dock 200 to transition from the locked state to an unlocked state enabling the electronic key 60 to be removed (or inserted) from the portable dock 200. In some cases, the portable dock 200 can be opened when removed from the key retention device 100 without additional security measures, such as a key or passcode. Similarly, an actuator in the key retention device 100 may transition the key retention device 100 from a locked state or an unlocked state, or vice versa, enabling removal or insertion of the portable dock 200 into a receiving portion 500 of the key retention device 100. The actuator may rotate, retract or otherwise remove locking arms, clamps, or other physical locking system from the portable dock 200 to enable removal of the portable dock 200 from the key retention device 100. The actuator may similarly rotate, extend, or otherwise engage locking arms, clamps, or other physical locking system to engage the portable dock 200 to prevent removal of the portable dock 200 from the key retention device 100.

In some implementations, the electronic key 60 may be associated with one or more personally-identifiable numbers (PINs). As such, when a PIN associated with the electronic key 60 is provided to the key retention device 100 when the electronic key 60 is stored in the portable dock 200 stowed in the key retention device 100, the locking system 600 can actuate (for example, the arms 612, 622) to allow the portable dock 200 to be removed from the key retention device 100.

In some implementations, a user input may be needed to remove the electronic key 60 from the portable dock 200 but not for returning the electronic key 60 to the portable dock 200. For example, a user may be required to provide a user input (for example, a PIN) to unlock the key holder 410, open the key holder 410, and/or remove the electronic key 60. Once the key is removed, a valid user input (for example, a PIN) may be required to close and lock the key holder without returning the electronic key 60. If returning the electronic key 60, a user can insert the electronic key 60 into the cavity 412 of the key holder 410 and close the key holder 410 (for example, move the key holder 410 from the open position to the closed position). Closing the key holder 410 with the electronic key 60 inside can automatically trigger the key retention device 100 to actuate its locking system 600 to lock the key holder 410 in place. Further, a PIN may or may not be required to lock the portable dock 200 into the key retention device 100. However, a PIN or passcode may be required to remove the portable dock 200 from the key retention device 100.

With reference to FIGS. 8A-13B, components of the portable dock 200 are described. As described herein, the key holder 410 and the base 404 can be rotatably coupled to each other. The portable dock 200 can include a pin 920 and screws 802A, 802B that can secure the connection between the key holder 410 and the base 404. The pin 920 can extend through both the key holder 410 and the base 404, and define an axis of rotation for the key holder 410. The screws 802A, 802B can be inserted into ends of the pin 920 to secure the pin 920 (for example, ensuring that the pin 920 extends through both the key holder 410 and the base 404). It should be understood that other connection mechanisms are possible. However, advantageously, the use of the pin 920 enables rotation of the key holder 410 with respect to the base 404 for access to the electronic key 60.

The base 404 can include a set of detents to improve coupling between the front cover 400 and the base 404. As shown in FIG. 9, the portable dock 200 can include detents 807A, 807B. The detents 807A, 807B can engage or fit through openings 870A, 870B, respectively, when the key holder 410 is in the closed position. In some implementations, the detents 807A, 807B can be spring-loaded ball detents such that they apply pressure against the openings 870A, 870B, respectively, to provide additional resistance for the key holder 410 moving from the closed position to the open position. This can advantageously prevent or reduce the likelihood of the key holder 410 accidentally moving from the closed position to the open position during use (for example, regardless of the portable dock 200 being stowed in the key retention device 100). It should be understood that the detents 807A, 807B may include other types of detents and that the detents 807A, 807B are not limited in type.

Figure 13B:
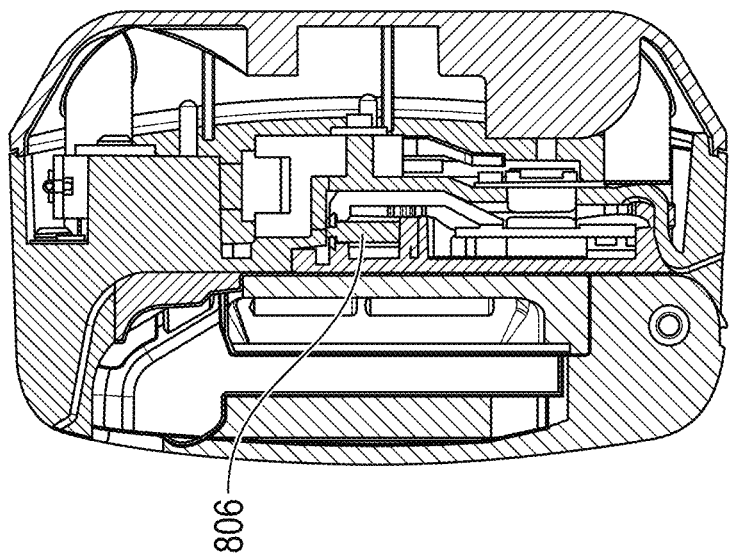
FIG. 13B illustrates a cross-sectional view of the example key retention device of FIGS. 2A and 2B along the lines 13B-13B, showing the example portable dock of FIGS. 8A-8C stowed in the example key retention device of FIGS. 2A and 2B.
Figure 13A:
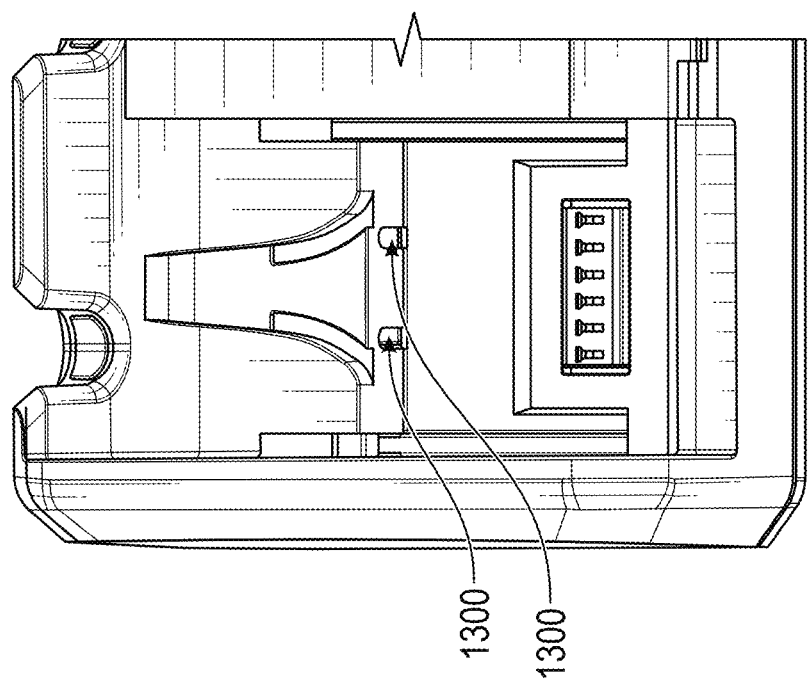
FIG. 13A illustrates example openings formed on a body of the key retention device of FIGS. 2A and 2B.

The base 404 can include detents 806 to improve coupling between the portable dock 200 and the key retention device 100. As shown in FIG. 13A, the receiving portion 500 of the key retention device 100 can include slots 1300. When the portable dock 200 is inserted into the receiving portion 500, the slots 1300 can engage the detents 806 to provide additional resistance for removal of the portable dock 200 from the receiving portion 500. In some implementations, the detents 806 can be spring-loaded ball detents such that they apply pressure against the slots 1300. The pressure applied against the slots 1300 can advantageously prevent or reduce the likelihood of accidental removal of the portable dock 200, for example, when the locking system 600 (for example, the arms 612, 622) is not in the locked position. It should be understood that the detents 806 may include other types of detents and that the detents 806 are not limited in type.

The base 404 can include a finger 804. The finger 804 can extend upward and may be shaped to at least partially cover an opening of the cavity 412 of the key holder 410 when the key holder 410 is in the closed position (for example, see FIG. 11A). The finger 804 can prevent the electronic key 60 from being inserted into the cavity 412 or from being removed when the key holder 410 is in the closed position. When the key holder 410 is in the open position (for example, see FIG. 11D), the finger 804 no longer extends over the opening of the cavity 412 and allows the electronic key 60 to be inserted into the cavity 412 or to be removed.

The base 404 can be coupled to an electronics housing 820 using screws 910 (see FIG. 9). The electronics housing 820 can include the strips 822 and the pins 420 (see FIGS. 4B and 10A). The strips 822 and the pins 420 are connected such that data and/or power can be transmitted between the strips 822 and the pins 420. As described herein the strips 822 can come in contact with the pins 502 of the key retention device 100. As such, when the strips 822 are in contact with the pins 502, the key retention device 100 can receive and/or transmit data and/or power from the pins 420 via the strips 822 and the pins 502. When the portable dock 200 storing the electronic key 60 is inserted into the receiving portion 500 of the key retention device 100, data can be transmitted between the electronic key 60 and the key retention device 100 via the electrical contacts 340 of the electronic key 60, the pins 420 and the strips 822 of the electronics housing 820, and the pins 502 of the key retention device 100. The electronics housing 820 can include any circuitry that facilitates data and/or power transfer between the key retention device 100, the portable dock 200, and/or the electronic key 60. For example, the electronics housing 820 may include electrical traces, coupling traces, network interface circuitry (e.g., Bluetooth® supporting circuitry, or RFID circuitry), a processor, or any other electronic component that may facilitate data and/or power transfer.

Figure 10B:
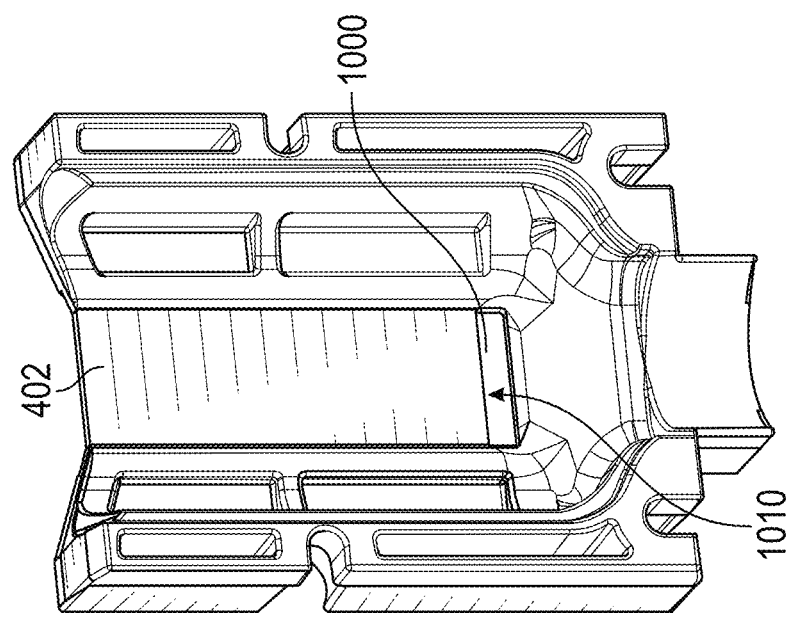
FIGS. 10B-10D illustrates various views of a rear portion of a key holder of the example portable dock of FIGS. 8A-8C.
Figure 10A:
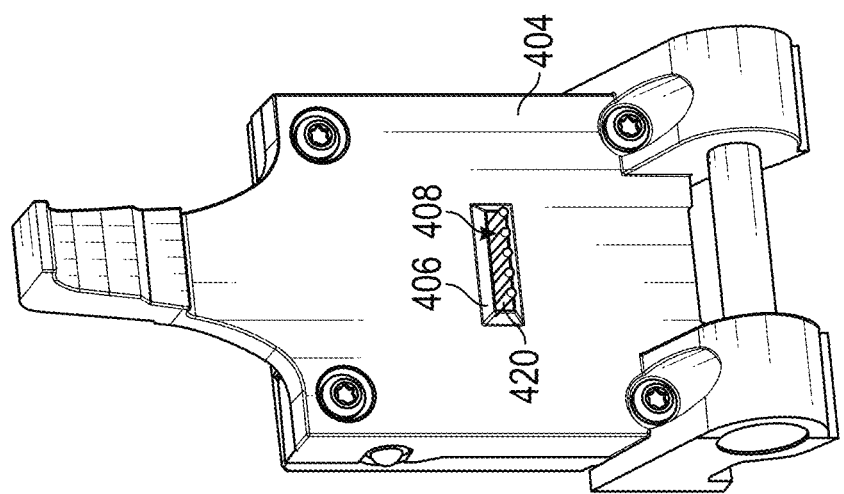
FIG. 10A illustrates a perspective view of a base portion of the example portable dock of FIGS. 8A-8C.
Figure 10D:
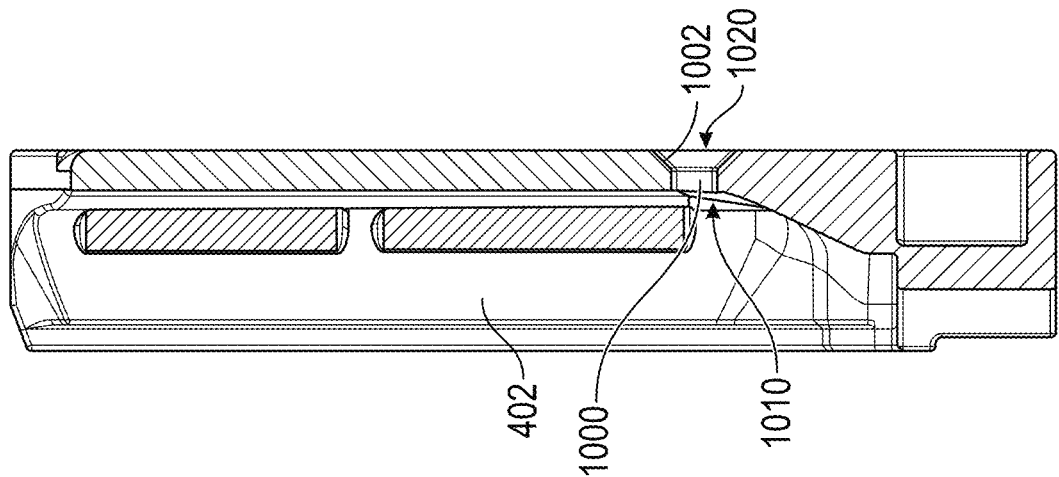
Figure 10C:
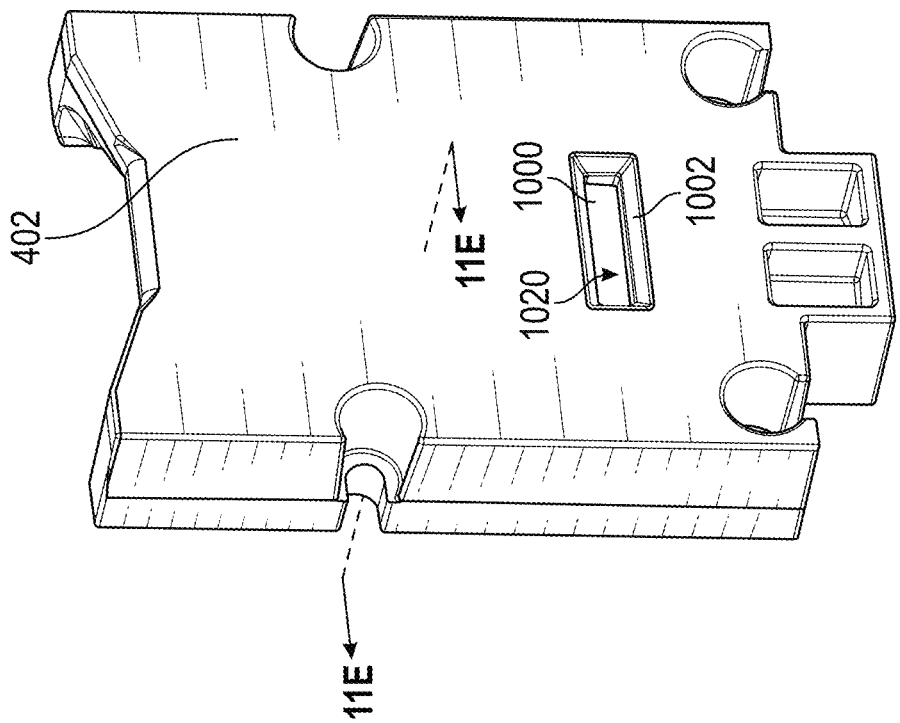

The slot 1000 of the key holder 410 can facilitate movement of the pins 420 into and out of the cavity 412. As shown in FIGS. 10B-10D, the pins 420 of the base 404 can extend through the front opening 1010 of the rear cover 402. The slot 1000 can include a front opening 1010 and a rear opening 1020. Edges 1002 of the slot 1000 can be tapered such that the dimensions of the rear opening 1020 can be greater than that of the front opening 1010 and the slot 1000. In some implementations, the dimensions of the slot 1000 can be substantially the same as that of the front opening 1010. The tapered edges 1002 (as shown in FIG. 10D) of the slot 1000 can prevent the pins 420 from contacting the edges 1002 as the key holder 410 rotates away from the base 404. FIGS. 11A-11G are cross-sectional views of the portable dock 200 that show relative positions of the slot 1000 and the pins 420 as the key holder 410 moves from the closed position to the open position.

The base 404 of the portable dock 200 can include hooks 840A, 840B. To insert the portable dock 200 in the receiving portion 500 of the key retention device 100, the portable dock 200 can be brought towards to the receiving portion 500 at an angle such that the hooks 840A, 840B are inserted into openings 1200 or slots of the body 110 of the key retention device 100. Once the hooks 840A, 840B are inserted into the openings 1200, a top portion of the portable dock 200 can be swung towards the receiving portion 500 while the hooks 840A, 840B remain inserted into the openings 1200 and abut against fingers 1202. Once the portable dock 200 is inserted into the receiving portion 500 of the key retention device 100, the hooks 840A, 840B may be seated on top of the fingers 1202 and positioned within the openings 1200 to provide support for the portable dock 200 and to prevent or reduce the likelihood of accidental decoupling of the portable dock 200 from the key retention device 100 when, for example, the arms 612, 622 are in the unlocked position.

In some implementations, the key retention device 100 can detect whether the portable dock 200 is present. When the portable dock 200 is present (regardless of the portable dock 200 storing the electronic key 60), the key retention device 100 can detect one of the strips 822 of the portable dock 200, such as a strip serving as a ground connection or other data and/or power connection, and determine that the portable dock 200 is present (for example, received by the receiving portion 500).

The portable dock 200 can include a communication port 830. The communication port 830 can be used to receive from and/or transmit data to the electronic key 60 housed within the portable dock 200. The data may be communicated between the electronic key 60 and any type of electronic device (e.g., remote devices 1430 of FIG. 14) configured to communicate with the electronic key 60. For example, the electronic device may be the key retention device 100 or a remote device 1430, such as a smart phone, a laptop, a desktop, a tablet computing device, an applications-specific computing device (e.g., a controller), and the like. Additionally, in some cases, the communication port 830 can be used to power or charge the electronic key 60 housed within the portable dock 200. This can be advantageous in circumstances where a user may be visiting a location that does not have a dock for receiving the electronic key 60. In such circumstances, the user can remove the portable dock 200 from the key retention device 100 and use the portable dock 200 to charge, change configurations, download audit trail data, update authentication settings, and the like by connecting the portable dock 200 to an electronic device using a wired or wireless connection. In some implementations, the communication port 830 can be a USB port (e.g., USB-A, USB-B, USB-B Mini, USB-B Micro, USB-C, etc.), a lightning port, a thunderbolt port, or any other type of port or connector that can transmit data and/or power between devices (for example, between the portable dock 200 and remote devices 1430). Further, the portable dock 200 and/or key retention device 100 may include a network interface system or network interface card (NIC) that may facilitate wired or wireless communication between the key retention device 100 and the portable dock 200, and/or with a remote device 1430.

As described above, in some cases, the portable dock 200 may include a transceiver. The transceiver may communicate with an antenna that can transmit and/or receive data or commands. In some cases, the antenna, or a second antenna may be used by the portable dock 200 to facilitate wireless power transfer.

Figure 14:
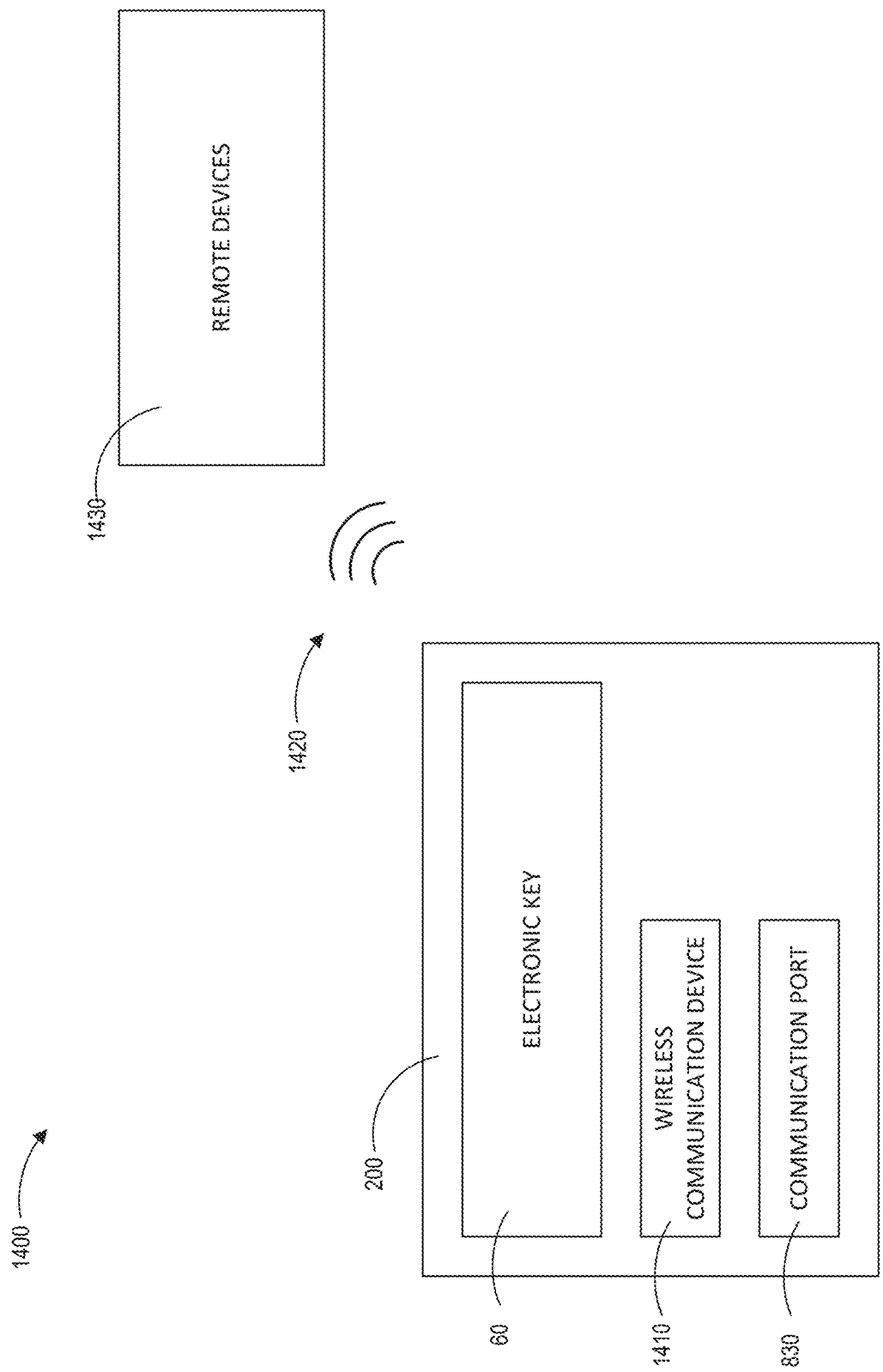
FIG. 14 illustrates an example operating environment for the portable dock of FIGS. 8A-8C when separate from the key retention device of FIGS. 2A and 2B.

FIG. 14 illustrates an example operation environment 1400 for the portable dock 200 when not stowed in the key retention device 100. In some cases, embodiments of the operation environment 1400 may be applicable when the portable dock 200 is stowed in the key retention device 100. The portable dock 200 can include a wireless communication device 1410 (e.g., a transceiver or network interface system) that can establish wireless communication 1420 between the electronic key 60 (when stored in the portable dock 200) and the remote devices 1430. The wireless communication device 1410 can use short-distance wireless communication protocols, long-distance wireless communication protocols, and/or other types of wireless communication protocols to allow the electronic key 60 to communicate (for example, transmit and receive data) with the remote devices 1430. Some non-limiting examples of short-distance wireless communication protocols that may be implemented by the wireless communication device 1410 include, but not limited to, Bluetooth®, WiFi, Near Field Communication (NFC), ZigBee, LoRa, and the like.

Additionally, the key retention device 100 can detect when the electronic key 60 is present. At least one of the electrical contacts 340 of the electronic key 60 can serve as a detector and can transmit data/signals via the pins 420 and the strips 822 of the portable dock 200 indicating the insertion status of the electronic key 60. The key retention device 100 can detect data and/or power from the detector and determine that the electronic key 60 is present. In some cases, a unique identifier is received from the electronic key 60 to determine whether the electronic key 60 is present, and the particular electronic key that has been inserted into the portable dock 200.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A key retention device configured to be non-removably attached to a structure and to secure a key, the key retention device comprising:
   a portable dock configured to house the key, wherein the portable dock is removably secured to the key retention device, wherein the portable dock comprises a key holder configured to receive the key, and wherein the key holder is configured to move between a closed position and an open position;
   a portable dock locking system comprising a locking arm configured to transition between a locked state and an unlocked state, wherein the portable dock locking system is configured to secure the portable dock to the key retention device;
   an actuator configured to transition the portable dock locking system between the locked state and the unlocked state by at least retracting the locking arm; and
   a docking seat configured to receive and couple with the portable dock.

2. The key retention device of claim 1, wherein, when the docking seat is coupled with the portable dock and, in response to receiving a first user input, a door of the portable dock is configured to move from the closed position to the open position.

3. The key retention device of claim 1, wherein, when the docking seat is coupled with the portable dock and, in response to receiving a second user input, the actuator is configured to cause the portable dock locking system to transition from the locked state to the unlocked state.

4. The key retention device of claim 1, wherein the structure comprises a vehicle.

5. The key retention device of claim 4, wherein the key retention device is further configured to receive power from the vehicle.

6. The key retention device of claim 1, wherein the structure comprises at least one of a building, a wall, or a gate.

7. The key retention device of claim 1, further comprising a transceiver configured to communicate with a remote computing system.

8. The key retention device of claim 7, wherein the portable dock includes the transceiver.

9. The key retention device of claim 1, wherein the locking arm of the portable dock locking system is configured to translate along an axis between a locked position corresponding to the locked state and an unlocked position corresponding to the unlocked state.

10. The key retention device of claim 9, wherein the axis corresponds to a width of the key retention device.

11. The key retention device of claim 1, wherein the portable dock further comprises a first protrusion, wherein the docking seat comprises a second protrusion, and wherein the first protrusion is configured to engage with the second protrusion to couple the portable dock with the docking seat.

12. The key retention device of claim 1, wherein the portable dock further comprises a first magnet, wherein the docking seat comprises a second magnet, and wherein the first magnet magnetically couples to the second magnet when the portable dock is positioned within the docking seat.

13. The key retention device of claim 1, further comprising a user interface configured to receive a user input in response to user interaction with the user interface.

14. The key retention device of claim 13, wherein the user interface comprises one or more of a keypad, a touchscreen interface, a dial, a knob, a button, or a biometric interface.

15. The key retention device of claim 1, further comprising a status indicator configured to indicate a status of a configuration of the key retention device.

16. The key retention device of claim 1, further comprising a status indicator configured to indicate a status of the key.

17. The key retention device of claim 1, further comprising a set of electrical contacts configured to electrically connect to a set of pins of the portable dock when the portable dock is coupled to the docking seat.

18. The key retention device of claim 17, wherein the set of electrical contacts are configured to communicate one or more of data, a command, or power between the key retention device and the portable dock.

19. The key retention device of claim 1, wherein the portable dock further comprises a detent configured to engage a slot of the docking seat when the portable dock is inserted into the docking seat.

20. The key retention device of claim 19, wherein the detent comprises a spring-loaded ball detent.

* * * * *